United States Patent [19]

Roberts et al.

[11] Patent Number: 5,594,354

[45] Date of Patent: Jan. 14, 1997

[54] METHOD FOR MEASURING SELECTED FREQUENCIES OF A COUPLED-DUAL RESONATOR CRYSTAL

[75] Inventors: Gerald E. Roberts; Michael E. Roberts, both of Lynchurg, Va.

[73] Assignee: Xtal Technologies, Ltd., Carle Place, N.Y.

[21] Appl. No.: 370,495

[22] Filed: Jan. 9, 1995

[51] Int. Cl.⁶ .................................................. G01R 29/22
[52] U.S. Cl. .................... 324/727; 324/652; 324/76.49
[58] Field of Search .............................. 324/649, 652, 324/653, 681, 682, 683, 707, 708, 709, 719, 727, 76.19, 76.21, 76.22, 76.25, 76.39, 76.49, 76.52, 76.77

[56] References Cited

U.S. PATENT DOCUMENTS

| | | | |
|---|---|---|---|
| 3,963,982 | 6/1976 | Roberts | 324/727 |
| 3,992,760 | 11/1976 | Roberts | 29/25.35 |
| 4,093,914 | 6/1978 | Peppiatt et al. | 324/727 |
| 4,433,316 | 2/1984 | Roberts et al. | 333/189 |
| 4,477,952 | 10/1984 | Crescenzi et al. | 29/25.35 |
| 4,484,158 | 11/1984 | Roberts et al. | 333/191 |
| 4,578,634 | 3/1986 | Healey et al. | 324/727 |
| 4,627,379 | 12/1986 | Roberts et al. | 118/721 |
| 4,676,993 | 6/1987 | Roberts et al. | 427/10 |
| 4,833,430 | 5/1989 | Roberts et al. | 333/191 |
| 4,839,618 | 6/1989 | Roberts et al. | 333/191 |
| 5,047,726 | 9/1991 | Roberts et al. | 324/727 |
| 5,049,828 | 9/1991 | Toliver et al. | 324/727 |
| 5,146,174 | 9/1992 | Toliver et al. | 324/727 |
| 5,272,597 | 12/1993 | Staples et al. | 361/816 |

OTHER PUBLICATIONS

Roberts, David A. et al., "On the Four-Frequency Measurement PRocess for Coupled Dual Resonator Crystals", IEEE Transactions on Instrumentation and Measurement, vol. 42, No. 5, Oct. 1993, pp. 924–926.

Primary Examiner—Kenneth A. Wieder
Assistant Examiner—Glenn W. Brown
Attorney, Agent, or Firm—Dorsey & Whitney LLP

[57] ABSTRACT

The present invention discloses a method for obtaining frequency parameters to determine the resonator frequencies, the synchronous peak separation frequency, and the normal center frequency of a coupled-dual resonator crystal. Under this method, a plurality of frequencies are applied to a first electrode. This application is performed once while the second electrode and the common electrode are connected by a short circuit, and then again when the second electrode and the common electrode are capacitively connected or open circuited. During each application of the plurality of frequencies to the crystal, the phase response for the output of the resonator circuit is monitored. Then the time response of the crystal is determined. Next, the time delay relative maxima for the time response is determined. Finally, the frequencies at which the time delay relative maxima occur are determined. These frequencies correspond to the inflection points where the change in phase goes from monotonically increasing to monotonically decreasing. These frequencies are used to calculate the resonator frequencies, the synchronous peak separation frequency, and the normal center frequency of the crystal. Alternatively, all of the critical frequencies can be determined with the second electrode and the common electrode connected by a short circuit. In this case, however, the critical frequencies correspond to the time delay maxima and minima for the time response. This method is applicable regardless of the frequencies of the resonators or the amount of frequency separation between the resonators.

11 Claims, 31 Drawing Sheets

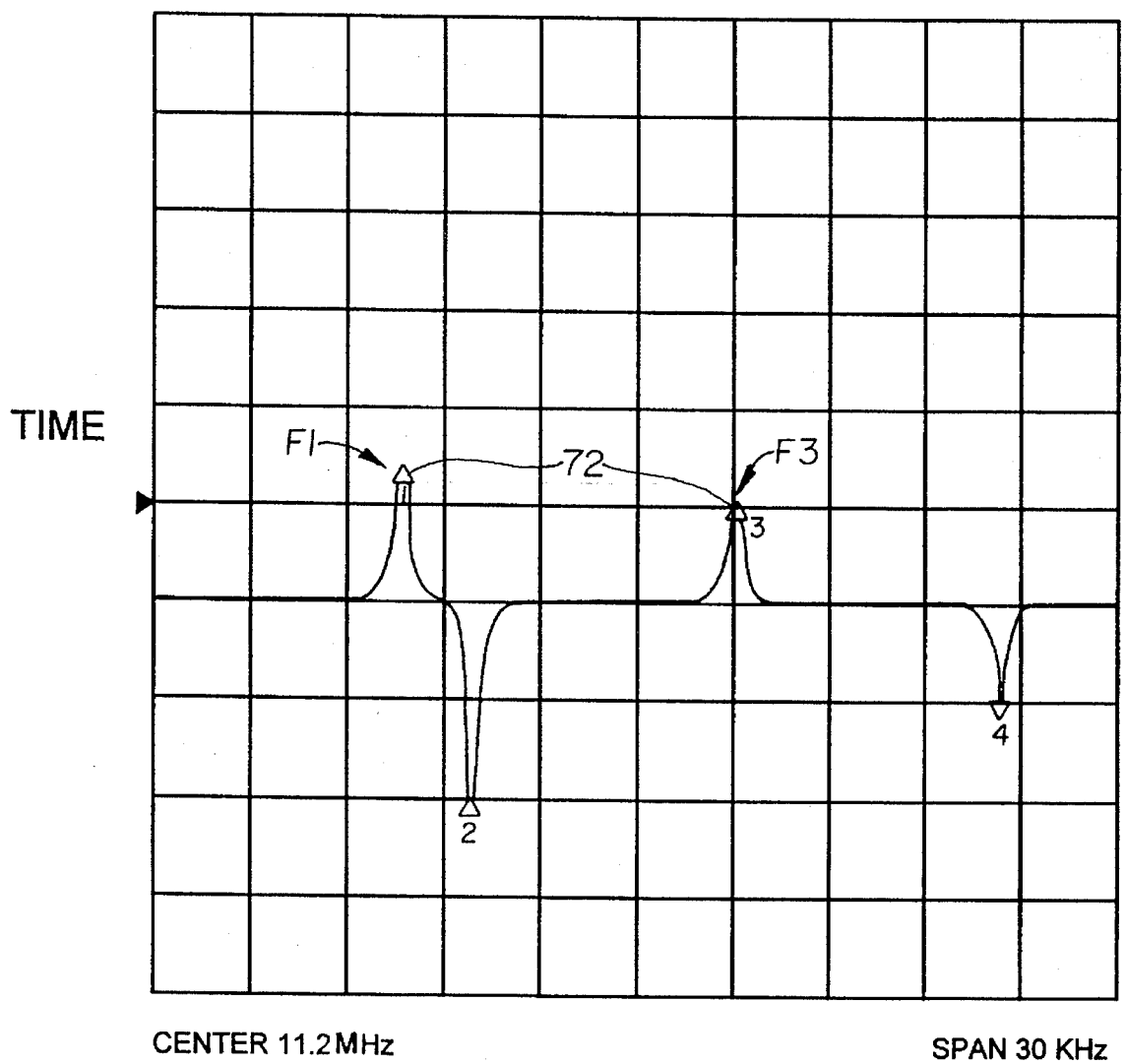

5,594,354

1

METHOD FOR MEASURING SELECTED FREQUENCIES OF A COUPLED-DUAL RESONATOR CRYSTAL

TECHNICAL FIELD

The present invention is generally related to a process for determining parameters of a monolithic coupled-dual resonator crystal. It is directed to a process to determine the resonator frequencies, the normalized center frequency and the synchronous peak separation frequency of crystals at higher fundamental and overtone frequencies and/or having relatively high resonator resistances.

BACKGROUND OF THE INVENTION

Such crystals are used extensively in the radio communication industry. Exemplary uses include IF filter and discriminator applications in mobile and cellular radios. Coupled-dual resonator crystals are preferred in many applications because they provide the characteristics of a very narrow filter due to the extremely high Q of the associated crystal resonators. Such very narrow filter characteristics are virtually impossible or extremely difficult to realize with lumped devices, such as inductors and capacitors.

At the time the original Peppiatt and Roberts methodology was invented, as taught in U.S. Pat. No. 4,093,914, coupled-dual resonator crystals were designed to operate at frequencies only as high as the low 20 megahertz ("MHz") range. Currently, units at 45 MHz and 57.5 MHz are routinely built in production. Because of the requirements for higher and higher IF frequencies for cellular and mobile radios, with units in the 70 MHz to 90 MHz frequency range being used or considered in new product applications, the requirement for superior measurement accuracy for such high frequency coupled-dual resonator crystals is vitally important for testing and fabricating coupled-dual crystals and for producing high frequency monolithic crystal filters which meet the new radio specifications.

Key characteristics of these coupled dual crystals must be measured during the fabrication process as well as at the final test operation. A need exists for a reliable, accurate, and repeatable process for determining these characteristics of a coupled-dual resonator crystal. In particular, four critical frequencies, F1, F2, F3, and F4 must be determined in order to calculate first and second resonator frequencies, the normalized center frequency, and the synchronous peak separation frequency. U.S. Pat. No. 4,093,914 discloses a process for measuring the four critical frequencies in coupled-dual resonator crystals and the formulas for determining the resonator frequencies, the normalized center frequency, and the synchronous peak separation frequency. The Peppiatt and Roberts methods involve determining four critical frequencies by monitoring, in the first case, one of the two crystal ports while shorting the second port. In the second case, they are determined by monitoring one of the two crystal ports while shorting the second port to obtain two frequencies and effectively open circuiting the second port or connecting a capacitor across it to obtain the other two frequencies. In the third case, taught in U.S. Pat. No. 5,047,726, the four critical frequencies are obtained by first monitoring the first port with the second port effectively open circuited, or with a capacitor connected across the second port, to obtain two of the frequencies, and then by monitoring the second port with the first port short circuited to obtain the other two critical frequencies. In each of the three cases, each of the four critical frequencies corresponds

2 to the zero phase crossing of the voltage phase response at or near the particular voltage amplitude maximum or minimum for the particular case in question.

It was discovered in U.S. Pat. No. 5,049,828 that as the desired fundamental or overtone operating frequencies of such coupled-dual resonator crystals increase and/or the effective resonator resistances increase, the measured phase excursions below the zero phase reference diminish and eventually fail to cross the zero phase reference. Also, it was additionally discovered that where one of the resonator frequencies (FA, for example) is much lower than that of the other resonator frequency (FB), the voltage amplitudes associated with two of the measured frequencies (F1 and F2) will be markedly higher than the voltage amplitude associated with the other two and the latter may not exhibit excursions below the zero phase reference.

Since such zero crossings are necessary for accurate frequency measurements, U.S. Pat. No. 5,049,828 to Toliver et al. discloses a compensation circuit to establish these zero phase reference points in the Peppiatt and Roberts transmission measurement system when applied to high frequency and/or high resonator resistance crystals. However, there are several problems with the compensation approach disclosed in the Toliver patent. It adds at least two additional circuit elements to the original fixture shown in FIG. 4 of U.S. Pat. No. 5,049,828 and it must be set or tuned to produce the required zero phase crossings. It is usually tuned to produce the four frequencies at the final crystal test operation. It, therefore, tends to have accuracy problems at frequencies other than final frequency. Separate fixtures must be used for coupled-dual resonator crystals in different frequency ranges. There also tend to be correlation problems from fixture to fixture whenever a fixture must be set by a variable coil/capacitor combination.

Therefore, the need arises as to how to determine the values of the four critical frequencies, F1, F2, F3 and F4, for the cases taught in U.S. Pat. Nos. 4,093,914, 5,047,726 and 5,049,828 for those situations where the phase responses do not provide undiminished zero phase crossings without external compensation.

SUMMARY OF THE INVENTION

To achieve these objects, the present invention discloses a method for obtaining the necessary frequency measurements to determine the resonator frequencies, the synchronous peak separation frequency, and the normal center frequency of the crystal. Under this method, a plurality of frequencies are applied to the first (or input) electrode of the crystal. In the preferred method, this approach is performed once while the second (or output) electrode and the common electrode are connected by a short circuit, and then again when the second electrode and the common electrode are open-circuited or connected with a capacitor.

During each application of the plurality of frequencies to the coupled-dual resonator crystals, the phase response of the driving point impedance is monitored via a voltage divider network as shown in FIG. 4A. Next, the time delay relative maxima which occur when the change in phase changes from monotonically decreasing to monotonically increasing are determined. Finally, the frequencies at which the time delay relative maxima occur are the critical frequencies (F1, F2, F3 and F4). These critical frequencies are used to calculate the resonator A frequency (FA), resonator B frequency (FB), the synchronous peak separation frequency (SPSF), and the normal center frequency (NCF) of the crystal.

This preferred process constitutes use of the time delay maxima for determining the four critical frequencies in case II of the four frequency measurement process taught in U.S. Pat. Nos. 4,093,914 and 5,047,726. It encompasses cases I and III taught in those patents as well. This process is believed to be applicable regardless of the frequencies of the resonators, the size of the intrinsic coupling between the resonators or the values of resonator resistances.

Using this method, the calculation of FA, FB, SPSF and NCF can be made very repeatably and very accurately at any step in the fabrication process. By not requiring an external compensation circuit, this novel measurement process provides a more accurate as well as more versatile measurement process since no re-tuning or re-calibration is required. The invention provides for improved crystal fabrication techniques, precision evaluation and testing of high frequency units, and the use of the present invention ultimately results in lower cost units with improved quality. It is an object of the present invention to provide a method of determining certain critical frequencies (i.e., F1, F2, F3, and F4) for coupled-dual resonator crystals operating at any frequency.

It is an object of the present invention to provide a method of calculating FA, FB, SPSF and NCF for much higher frequency coupled-dual resonator crystals.

It is an object of the present invention to determine the critical frequencies and calculate FA, FB, SPSF and NCF without the use of an external compensation circuit.

It is an object of the present invention to provide a method of determining the critical frequencies and calculating FA, FB, SPSF and NCF at any stage of the fabrication process without the need for re-tuning or re-calibration.

It is an object of the present invention to provide a method of accurately and repeatably determining the critical frequencies and calculating FA, FB, SPSF and NCF that provides results independent of resonator resistances.

BRIEF DESCRIPTION OF THE DRAWINGS

FIGS. 6A through 6H show voltage amplitude, phase, and time responses explaining the method of the present invention for a 11.2 MHz crystal.

DETAILED DESCRIPTION OF THE PREFERRED EMBODIMENT

Figure 1:
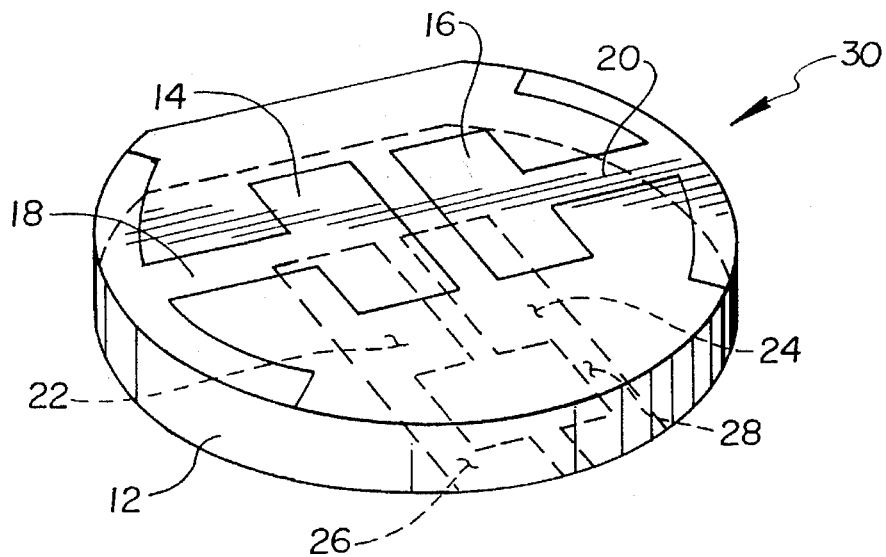
FIG. 1 is a perspective view of a coupled-dual resonator crystal.
Figure 2A:
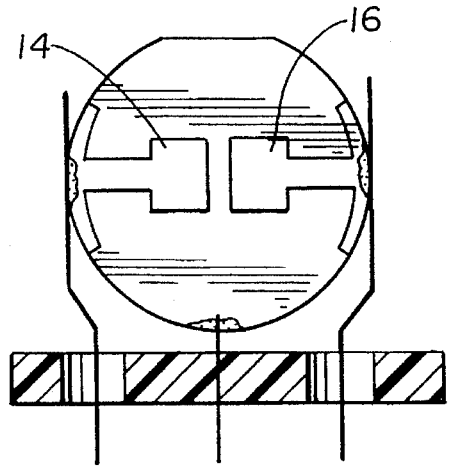
FIGS. 2A and 2B show the active and ground sides of mounted crystals.
Figure 2B:
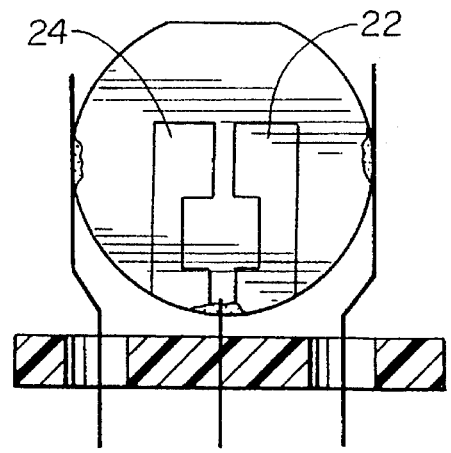
Figure 3:
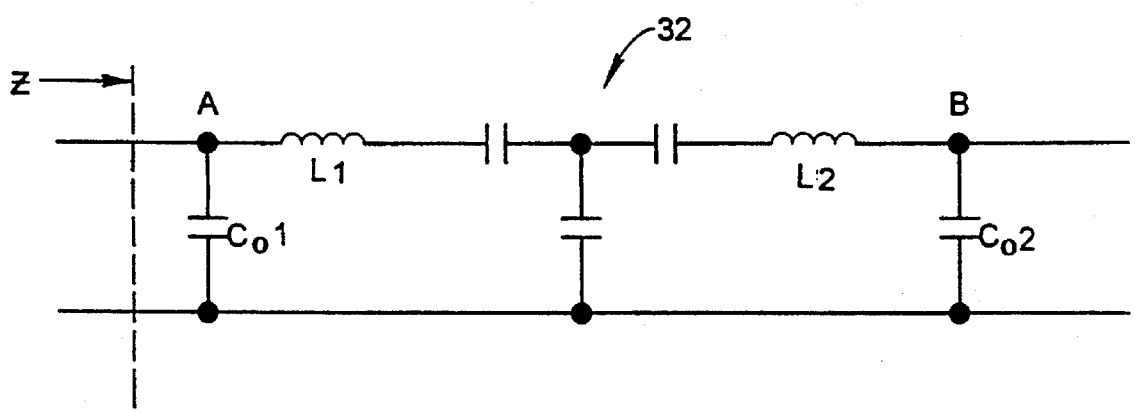
FIG. 3 illustrates an equivalent circuit of a coupled-dual resonator crystal.

Typically a coupled-dual resonator crystal in its simplest form is constructed in a manner generally shown in FIGS. 1, 2A and 2B. Such crystal structure includes a first and second resonator each formed by a pair of thin film electrodes (14 and 22, 16 and 24, respectively) deposited on opposite sides of a piezoelectric wafer (12) with electrical connections to the electrodes being made by way of leads 18, 20, 26 and 28. Although rectangular electrodes are illustrated, circular and semi-circular electrodes, for example, may also be used. FIG. 3 shows an equivalent circuit 32 of the coupled-dual resonator crystal 30 shown in FIGS. 1, 2A and 2B.

Initial nominal electrode dimensions in such structures are conventionally obtained through the use of precision masking techniques or laser machining operations as explained in commonly assigned U.S. Pat. No. 4,839,618. Subsequent measuring and manufacturing steps are performed leading to the last operation prior to sealing, namely, the final frequency adjustment process. This last operation is extremely critical since the two resonator frequencies (FA and FB) and the synchronous peak separation frequency (SPSF), as defined in commonly assigned U.S. Pat. No. 4,093,914, must be precisely controlled in order to obtain a coupled-dual resonator crystal of desired characteristics. Such criticality is even further heightened where the desired characteristics include those required for use in a high quality mobile radio IF filter with operating frequencies above about 45 MHz, for example, or with one or both effective resonator resistance values sufficiently large as compared to the effective resonator reactances. That is to say, such criticality exists any time that the combination of motional resistance and reactance for a mode of vibration is such that phase values corresponding to one or both voltage amplitude maxima associated with the driving-point impedance would fail to cross zero phase when using the conventional approach of the 4,093,914 patent.

Figure 4A:
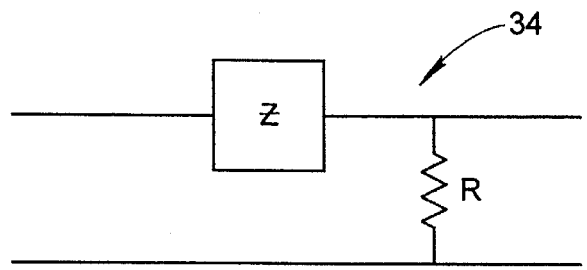
FIGS. 4A and 4B show the voltage divider network and the fixture realization for obtaining the four frequencies, F1, F2, F3 and F4.

As indicated in the Peppiatt and Roberts '914 patent, the coupled-dual resonator crystal 30 shown in FIG. 3 is positioned such that its driving-point impedance, Z, is displayed in a voltage divider network 34 shown in FIG. 4A, from which the four frequencies are obtained for Cases I and II as taught by Peppiatt and Roberts and Case III as taught by Roberts et al. in U.S. Pat. No, 5,047,726. The actual test fixture 36 realization of FIG. 4A is shown in FIG. 4B where switch S1 is used to short-circuit the B resonator 16 of the crystal 30 or open circuit it (or put a capacitor C3 across the resonator terminal and the crystal common terminal).

Figure 4B:
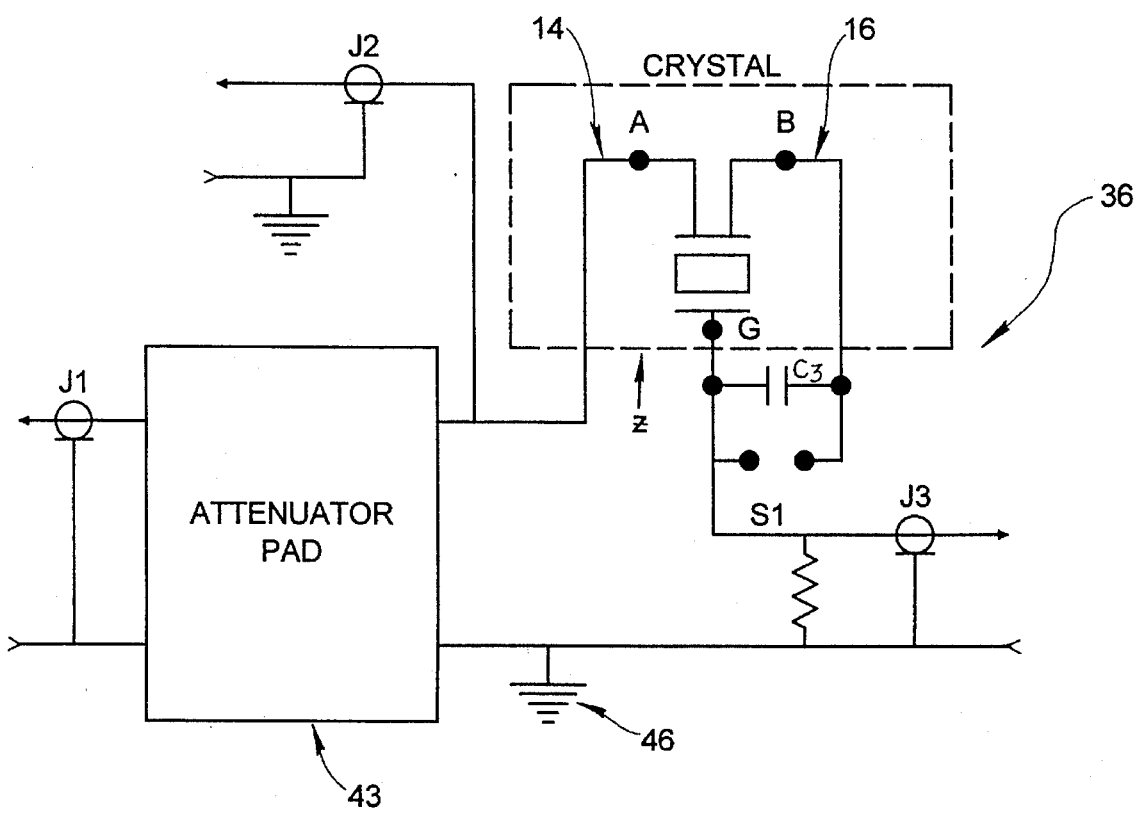

More specifically, the frequencies F1 through F4 are measured using a circuit as illustrated in FIG. 4B with a frequency synthesizer connected at J1 and the A and B probes of a vector voltmeter connected to J2 and J3, respectively. Frequencies F2 and F4 are obtained when the A side of the coupled-dual resonator is driven by a frequency synthesizer with the B side effectively open circuited (or a capacitor C3 is connected across the B side). Frequencies F1 and F3 are obtained in a similar manner but with the B side short circuited. Thereafter, key crystal parameters such as resonator frequencies (FA and FB), normalized center frequency (NCF) as well as the synchronous peak separation frequency (SPSF) may be calculated using the F1 through F4 frequencies and the equations taught in the Peppiatt and Roberts patent.

The appropriate voltage amplitude and phase information is available at the vector voltmeter B-probe. By monitoring probe J3, the time response, T, can be generated from the phase information using $T = -[d\emptyset/d\omega] = -[1/(2\pi)][d\emptyset/df]$, where $\emptyset$ is voltage phase, $\omega$ is radian frequency, and f is frequency.

The appropriate relative maxima and relative minima of the resulting time response can then be used to determine the appropriate four frequencies for any of the three cases. However, it is preferred to use a Network Analyzer/S-parameter test set in place of both the frequency synthesizer and vector voltmeter because the Network Analyzer/S-parameter test set 38 allows for obtaining the time response directly.

Figure 5:
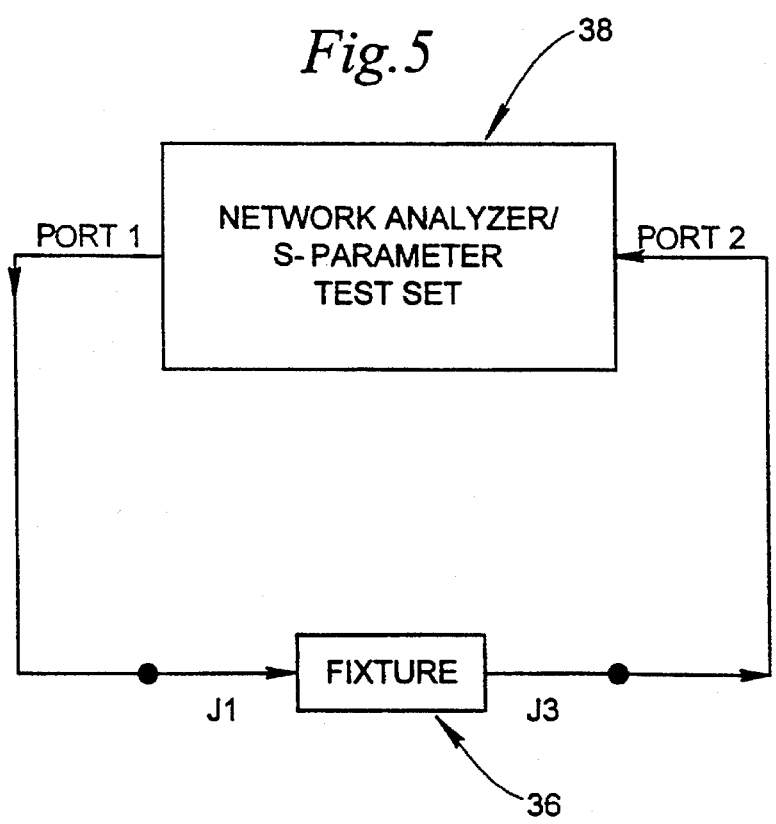
FIG. 5 shows the connection of a Network Analyzer/S-parameter test set to the test fixture.

FIG. 5 shows the configuration with the analyzer 38 port 1 connected to J1 of the test fixture 36 and port 2 connected to J3 of the fixture 36. Network Analyzer/test sets such as the HP8751A or HP3577A are of the type appropriate for determining a time response directly. The preferred embodiment is the usage of time delay relative maxima (and relative minima for case I) in case II, but it is equally valid for cases I and III.

The Network Analyzer/S-parameter test set 38 is used as connected in FIG. 5 with the crystal 30 inserted into the fixture 36 as in FIG. 4B. The S-parameter, $S_{21}$, is monitored and is a measure of output voltage amplitude and phase relative to a reference input voltage and phase. The reference output voltage, phase and time delay lines are set using a short in the socket (dotted box in FIG. 4B) from point A to common point G. Also, the various ranges and scales are set on the analyzer 38. All of this basically initializes the analyzer 38. The crystal 30 is inserted in the fixture 36 after the short is removed. Then the internal synthesizer of the analyzer 38 is swept over the frequency range of interest with S1 closed. Frequencies F1 and F3 are read at the time delay relative maxima. Then S1 is opened either open circuiting the B-port (or B-side) of the crystal or connecting a capacitor C3 across the B-side. The internal synthesizer of the analyzer 38 is again swept over the frequency range of interest, and frequencies F2 and F4 are read at the time delay relative maxima. It is noted in FIGS. 6H, 7J and 8J, the frequencies F2 and F4 occur at the frequencies associated with marks 1 and 3. Then equations (1), (2) and (3), provided below, are used to calculate FA, FB and SPSF. Since the time delay relative maxima associated with F1 and F3 are in the mathematical neighborhood of the corresponding amplitude relative maxima, it is convenient to find the amplitude relative maxima first and then determine the time delay relative maxima from the time delay response to obtain F1 and F3, and likewise for F2 and F4.

As indicated in U.S. Pat. Nos. 4,093,914 and 5,047,726, both of which are herein incorporated in full by reference, it is clear that this process lends itself to automatic programming with a number of different algorithms depending on what type of Network Analyzer/S-parameter test set or frequency synthesizer/vector voltmeter or similar equipment is used. In essence, the detailed process outlined above is one type of general algorithm for determining F1, F2, F3 and F4 for case II.

In case II, the F1, F2, F3 and F4 frequencies occur at inflection points where the change in phase goes from monotonically decreasing to monotonically increasing (concave down to concave up). In addition, [dØ/dω] goes from decreasing to increasing, therefore, time delay becomes $T = -[dØ/dω] = -[1/(2\pi)][dØ/df]$ which shows that time delay T goes from increasing to decreasing which is a relative maxima at those points.

As shown in U.S. Pat. No. 5,047,726, case III follows case II with regard to using time delay for F1, F2, F3 and F4. In case I, F2 and F4 are determined by detecting the time delay relative minima when the switch S1 is closed.

Once the critical frequencies are obtained, the resonator A frequency (FA), the resonator B frequency (FB), the normalized center frequency of the crystal 30 (NCF), and the synchronous peak separation frequency (SPSF) can be determined by the equations disclosed in U.S. Pat. No. 4,093,914, as provided below for case II:

$$FA = [(F2^2 F4^2 - F1^2 F3^2)/(F2^2 + F4^2 - F1^2 - F3^2)]^{1/2} \quad (1)$$

$$FB = [F2^2 + F3^2 - FA^2]^{1/2} \quad (2)$$

$$NCF = [F1 F3]^{1/2} \quad (3)$$

$$SPSF = [(FA^2 FB^2 - F1^2 F3^2)/(F1 F3)]^{1/2} \quad (4)$$

It will be understood by those of ordinary skill in the art that any of the alternative configurations disclosed in U.S. Pat. No.'s 4,093,914, 5,047,726 and 5,049,828 which were disclosed with respect to the amplitude maxima and zero phase method can also be used with the time delay maxima process or time delay maxima and minima process depending on which of the three cases are being used. However, instead of determining the critical frequencies at or near the amplitude maxima and where the phase response crosses the zero phase line, the critical frequencies are determined by finding the frequencies at which the appropriate time delay relative maxima occur or at which the appropriate time delay relative maxima and minima occur depending on the particular case being used.

In the following paragraphs, three examples of the operation of the present invention will be described. The coupled-dual resonator crystal in FIG. 4B being operated at 11.2 megahertz ("MHz"), 21.4 MHz, and 70.2 MHz are used as illustrative case II examples of the present invention.

FIGS. 6A through 6H graphically illustrate the measurement of the frequencies F1, F2, F3, and F4 for calculation of FA, FB, NCF and SPSF. Also, FIGS. 6A through 6H allow for comparison between the zero phase process and the time delay relative maxima process in determining the frequencies F1, F2, F3, and F4 when the coupled-dual resonator crystal is operated at 11.2 MHz.

Figure 6A:
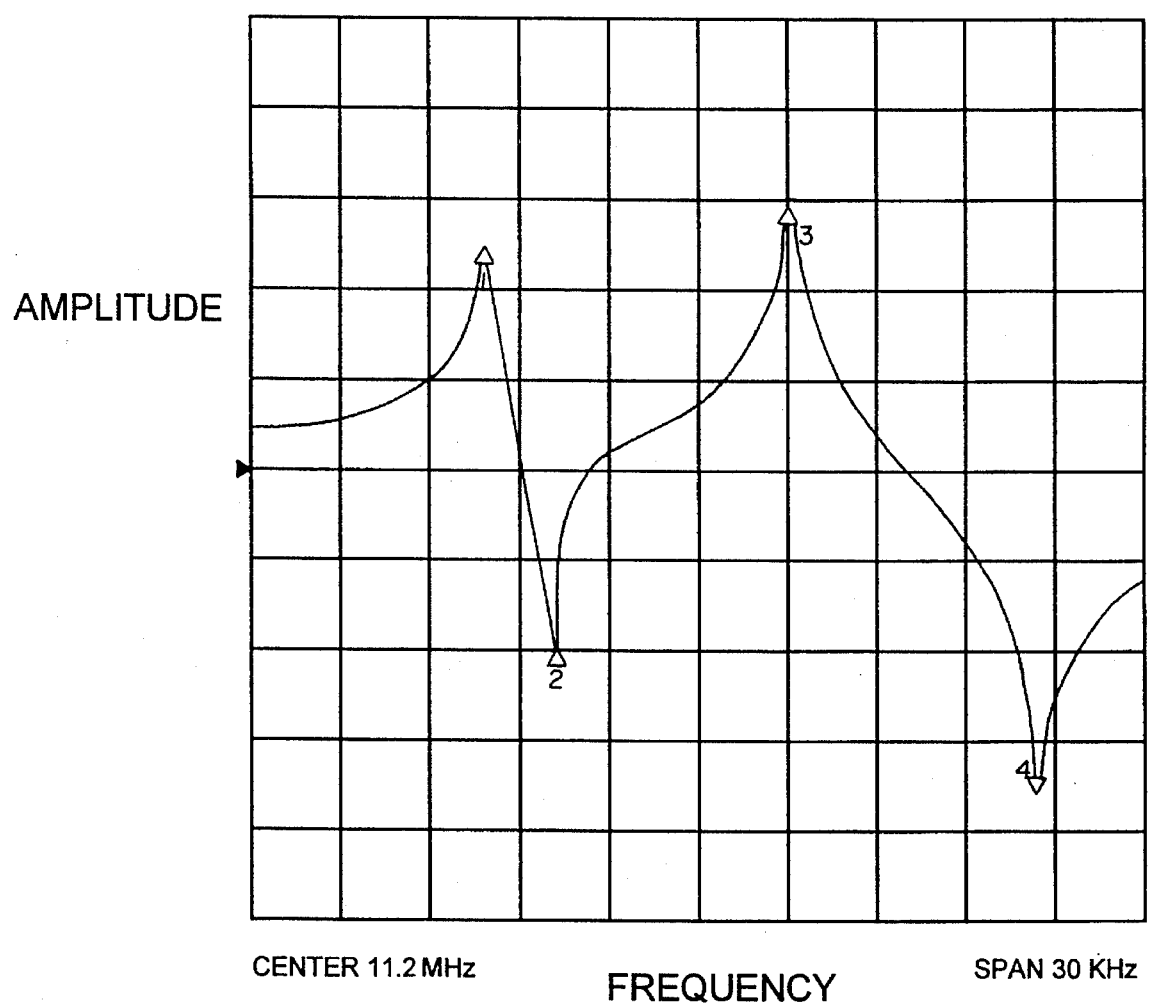
Figure 6B:
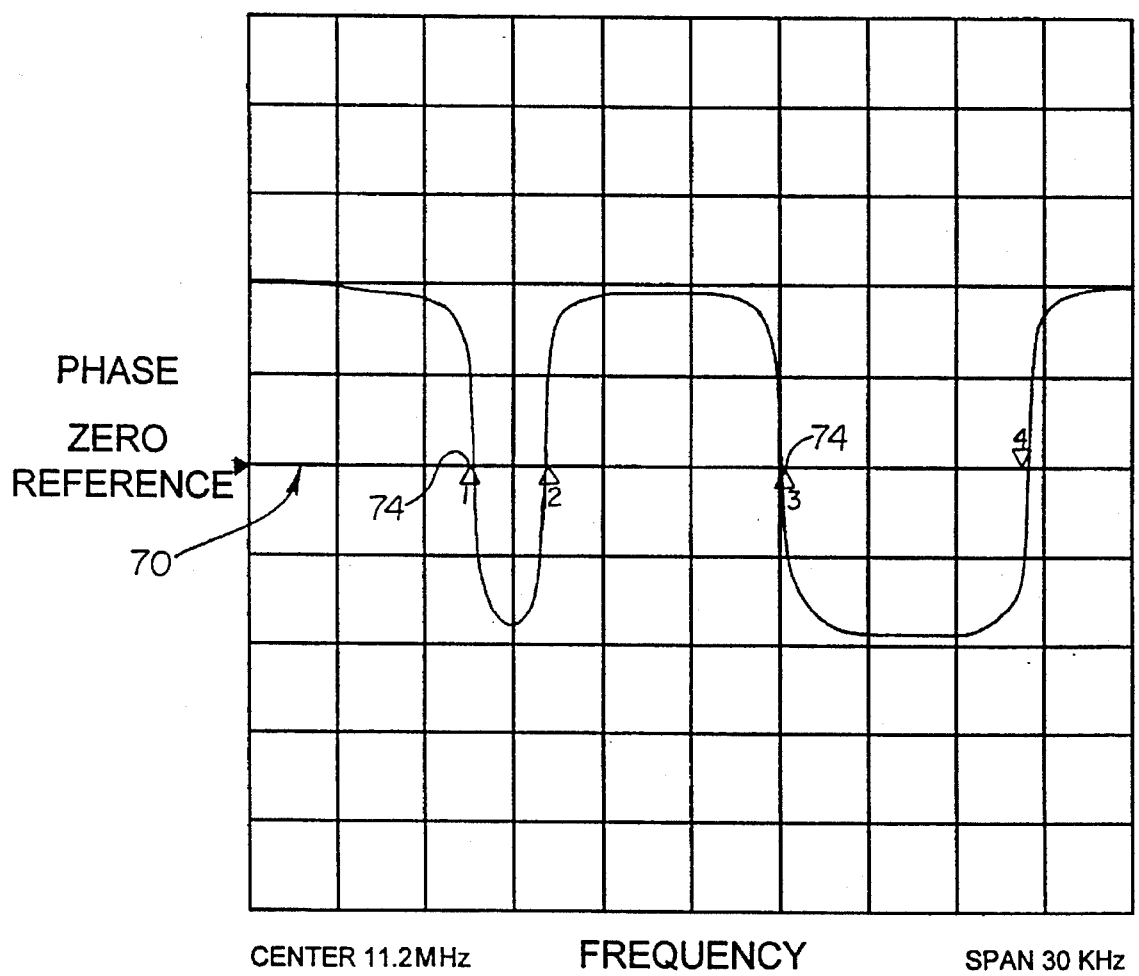
Figure 6D:
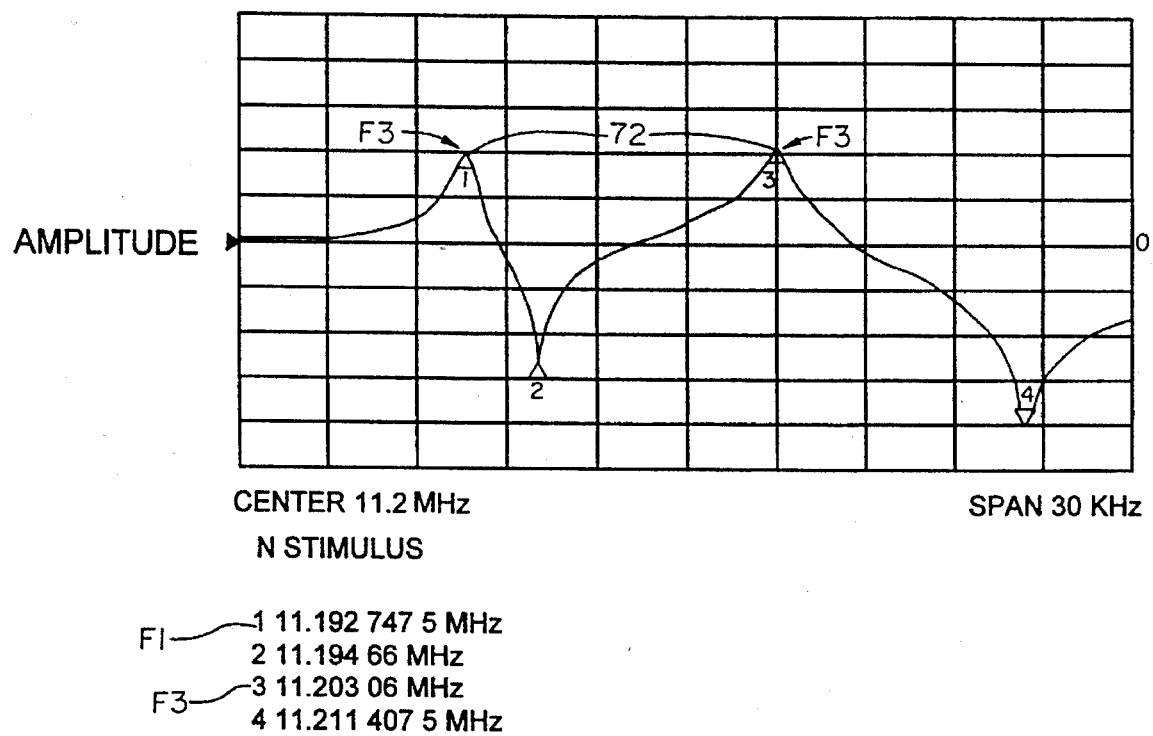
Figure 6E:
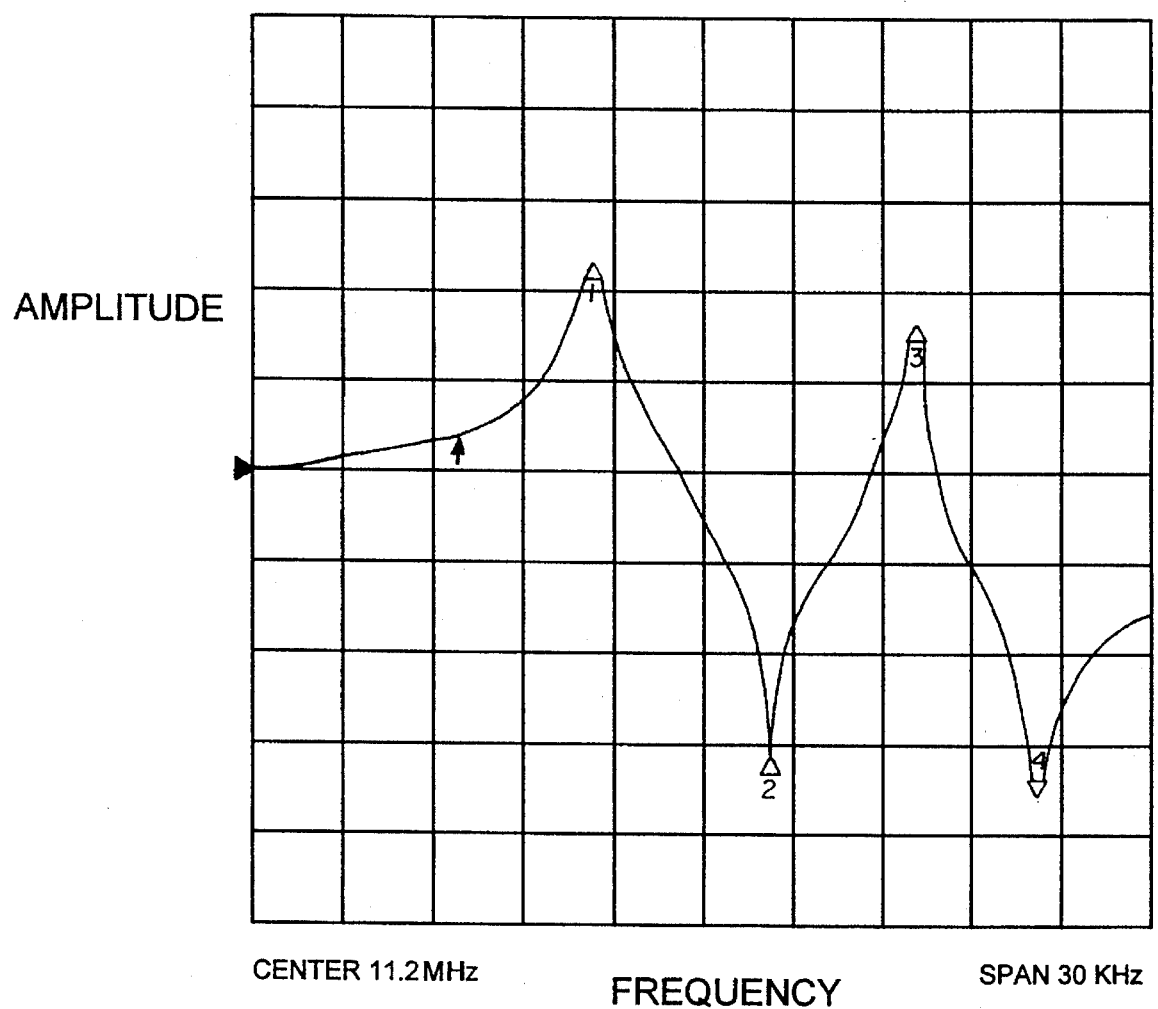
Figure 6F:
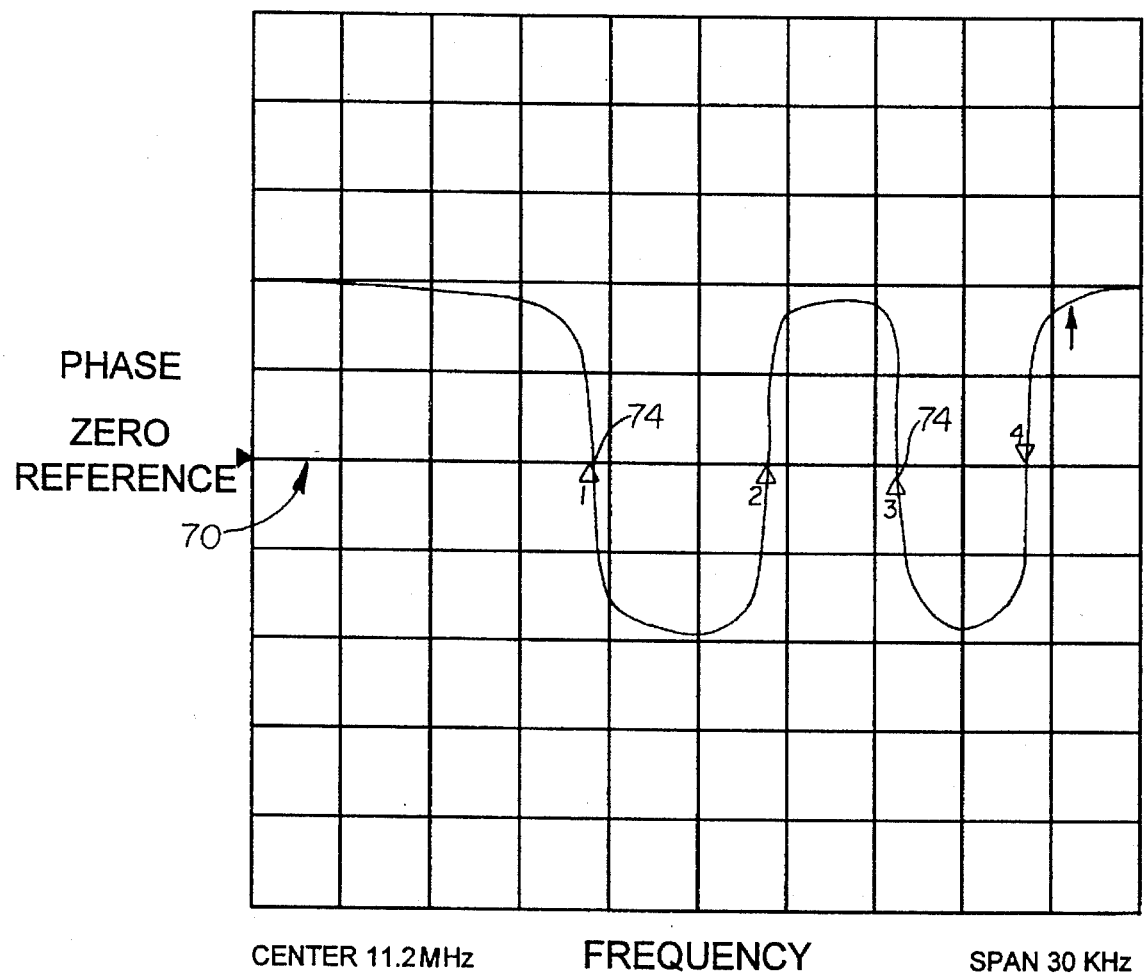
Figure 6G:
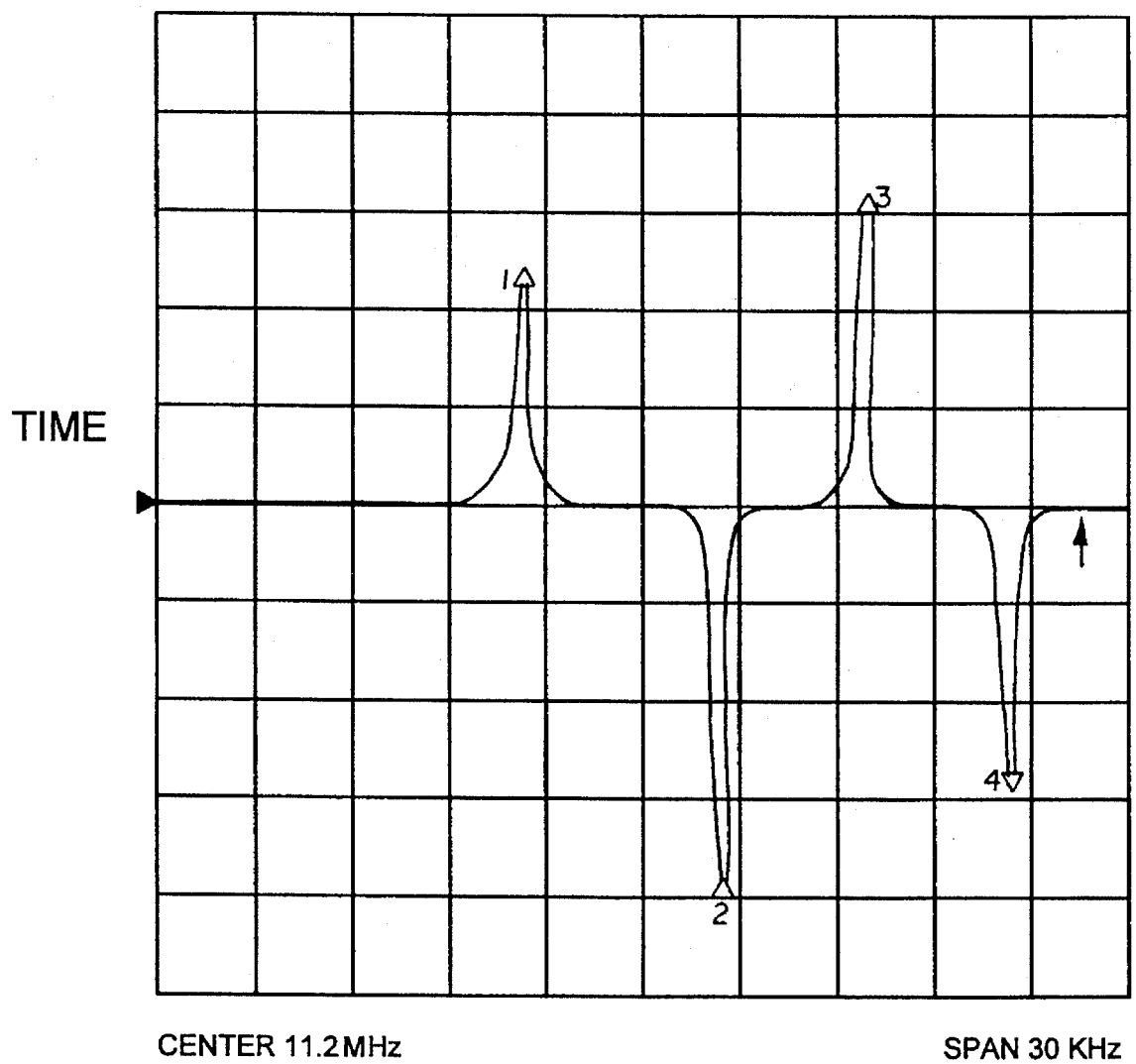

FIGS. 6A and 6E show the voltage amplitude responses when resonator B is effectively short circuited (FIG. 6A) and when resonator B is effectively open circuited (FIG. 6E) with 5 pf capacitance across it, respectively. Similarly, FIGS. 6B and 6F show the phase responses for a short circuited and effectively open circuited resonator B respectively. FIGS. 6C and 6G show the time delay response with the time delay relative maxima points 72 from the phase response shown in FIGS. 6B and 6F.

Referring to FIGS. 6B and 6F for the 11.2 MHz crystal, the phase responses have certain points 74 which cross the zero phase line 70. As described above, the frequencies at which the phase responses cross the zero phase line 70 will occur at or near the frequencies of the voltage amplitude maxima. These frequencies correspond to the critical frequencies used to calculate FA, FB, NCF and SPSF.

Figure 6H:
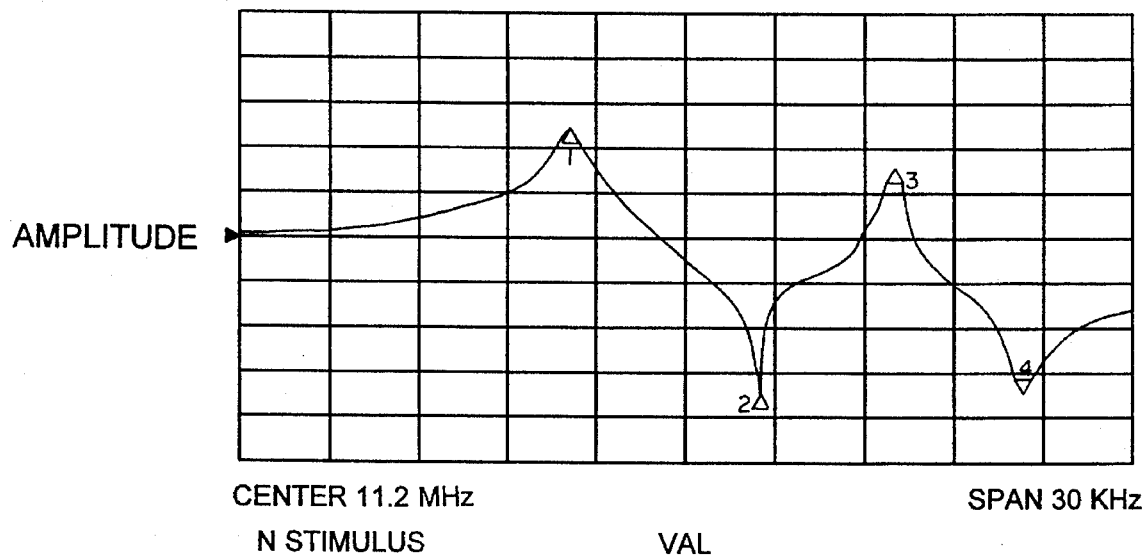

As shown by FIGS. 6A, 6C, 6E and 6G, the time delay maxima of the time response occurs at the same frequency as the amplitude maxima. Consequently, at 11.2 MHz, both the zero phase method and the time delay maxima method can be used to measure the frequencies F1, F2, F3, and F4. FIGS. 6D and 6H show numerical values for frequencies F1–F4 for a coupled-dual resonator crystal operated at 11.2 MHz. Referring to FIG. 6D, F1=11,192,747 Hz and F3=11,203,060 Hz. Referring to FIG. 6H, F2=11,196,302 Hz and F4=11,206,630 Hz. Consequently, using these values, FA=11,199,673 Hz, FB=11,196,136 Hz, SPSF=9687 Hz, and NCF=11,197,902 Hz.

Any differences between the frequencies of the amplitude maxima, the corresponding frequencies of the zero phase crossings, and the corresponding frequencies of the time delay maxima are on the order of Hertz—they are slightly different because of the finite resistance of each resonator. However, these very small differences in frequency are negligible for purposes of determining F1, F2, F3, and F4 and calculating FA, FB, NCF, and SPSF accurately and repeatably.

Figure 7A:
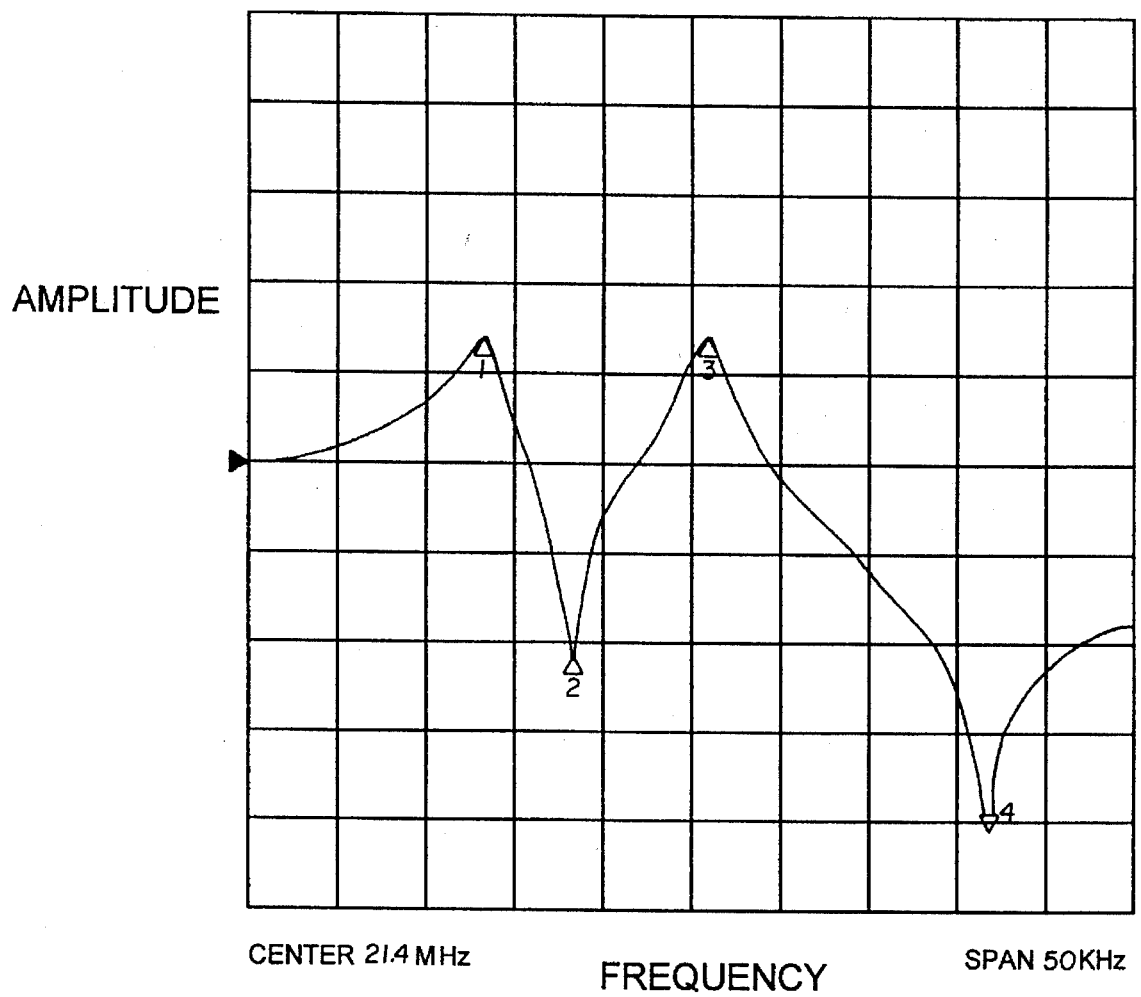
FIGS. 7A through 7J show voltage amplitude, phase, and time responses explaining the method of the present invention for a 21.4 MHz crystal.
Figure 7B:
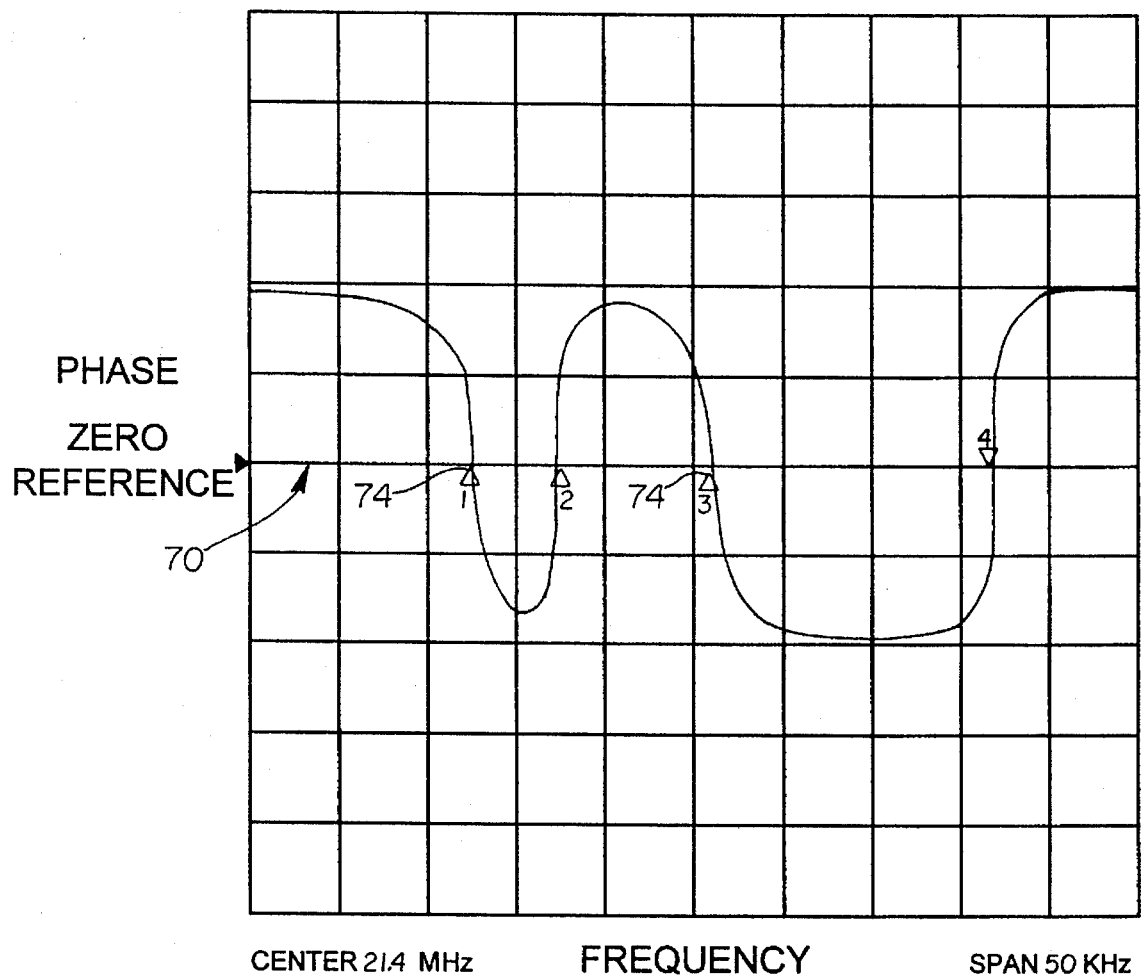
Figure 7C:
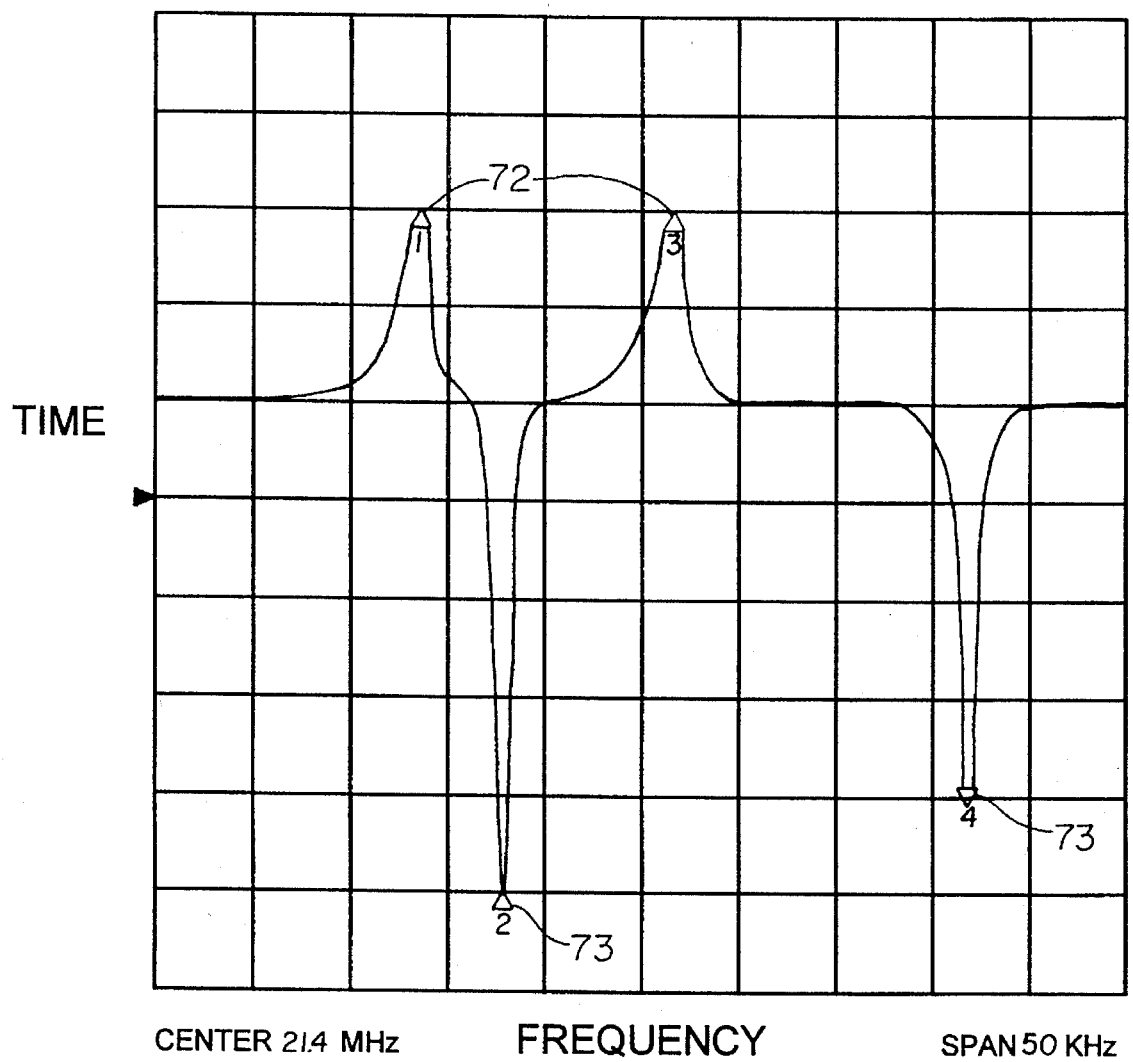
Figure 7D:
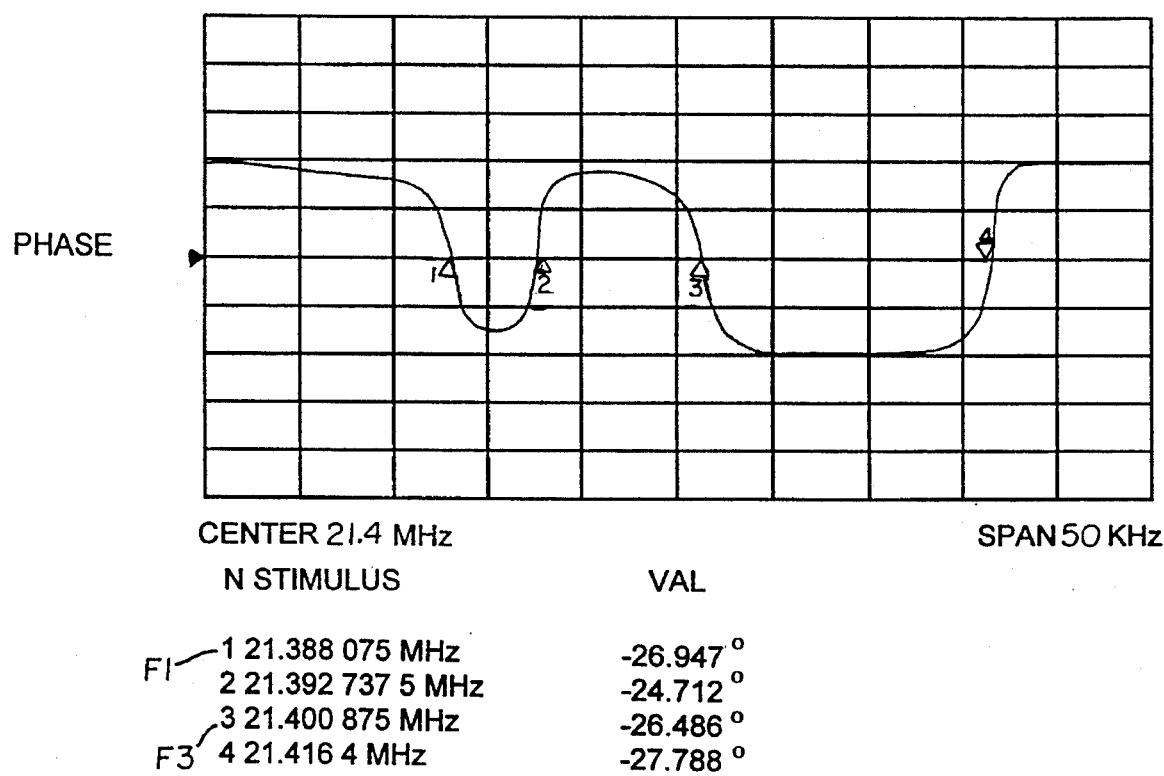
Figure 7E:
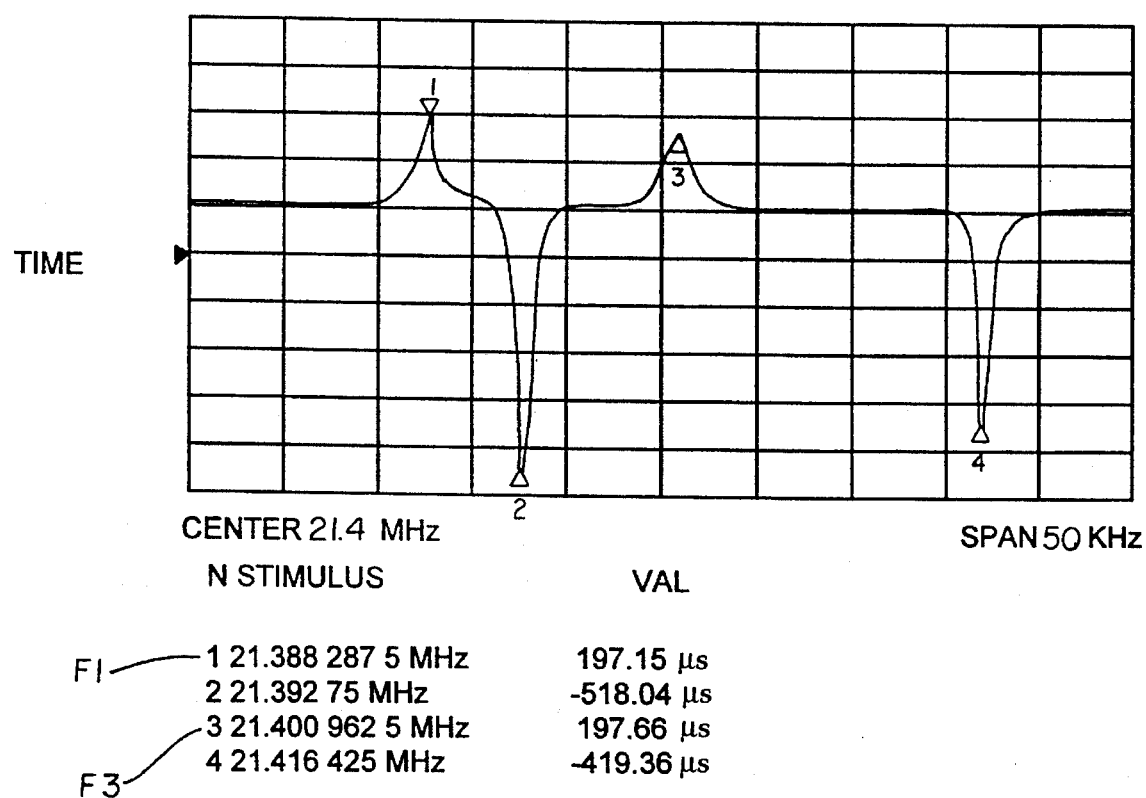

Now, referring to FIGS. 7A through 7J, the determination of the characteristics of a 21.4 MHz crystal in FIG. 4B is described. For the case when resonator B is short circuited, FIGS. 7A through 7C show the amplitude response (FIG. 7A), the phase response (FIG. 7B) having several zero phase crossings 74, and a time delay response (FIG. 7C) having maxima points 72 and minima points 73. Referring to FIG. 7D, using the zero phase method, F1=21388075 Hz and F3=21400875 Hz. Referring to FIG. 7E, using the time delay relative maxima process, F1=21388287 Hz and F3=21400962 Hz.

Figure 7F:
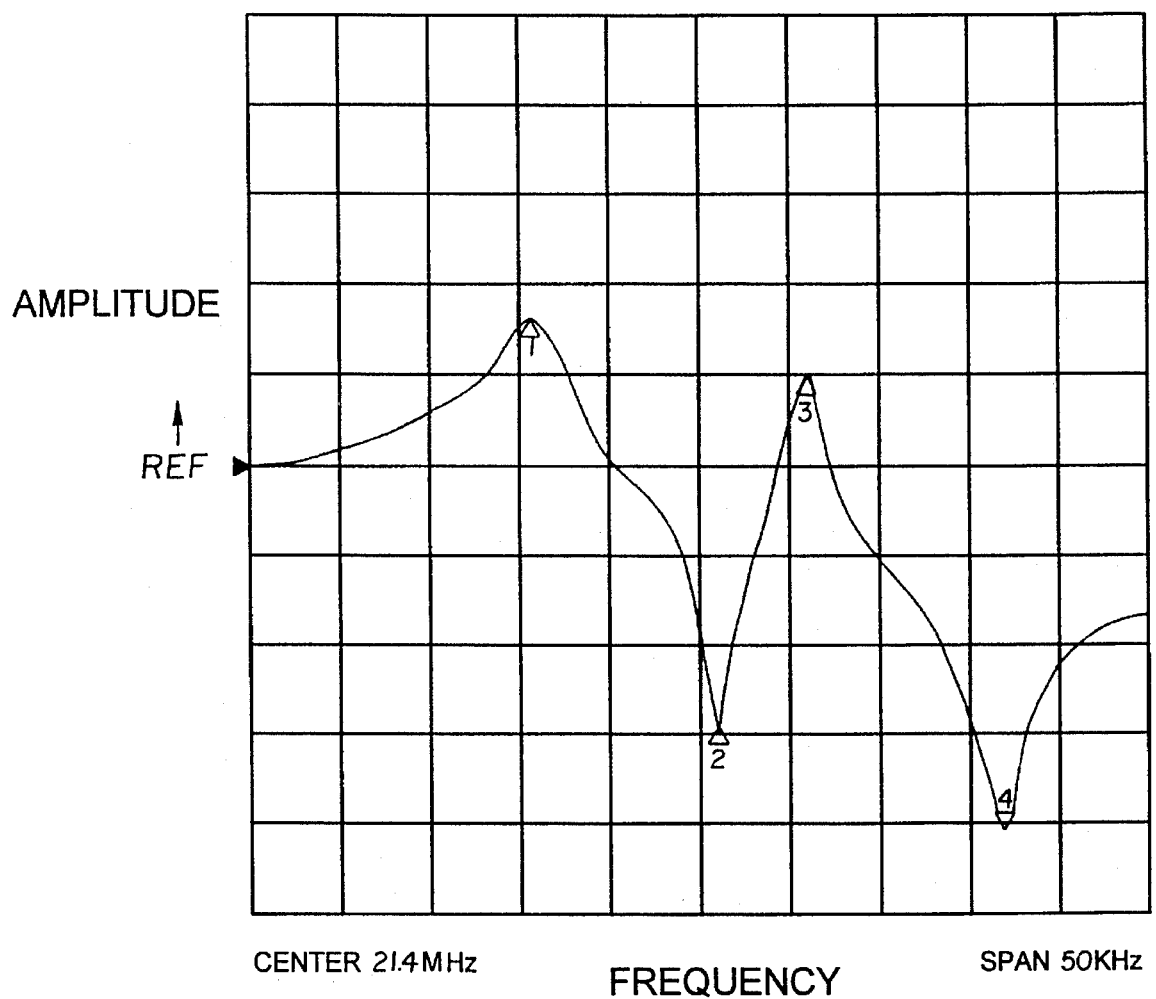
Figure 7G:
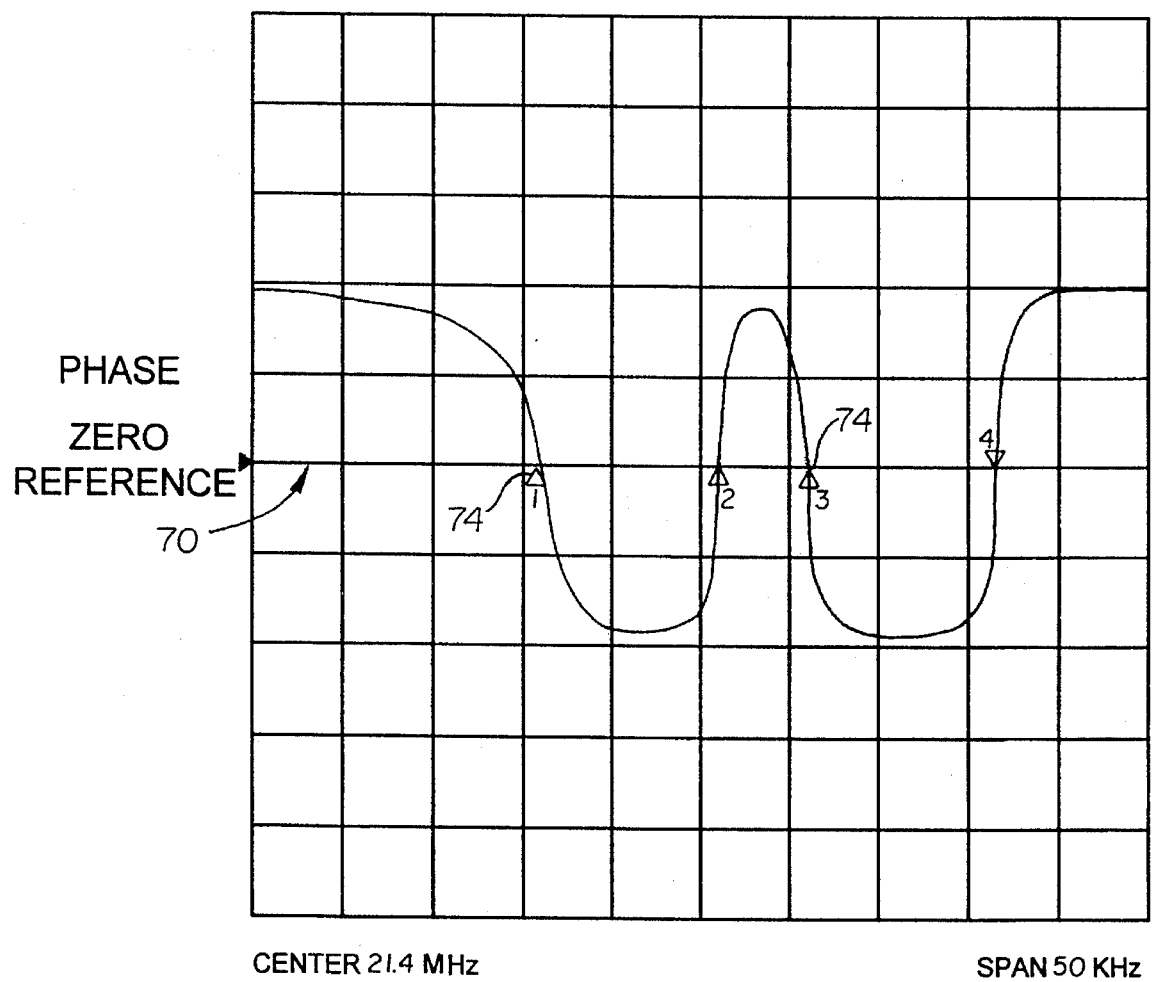
Figure 7H:
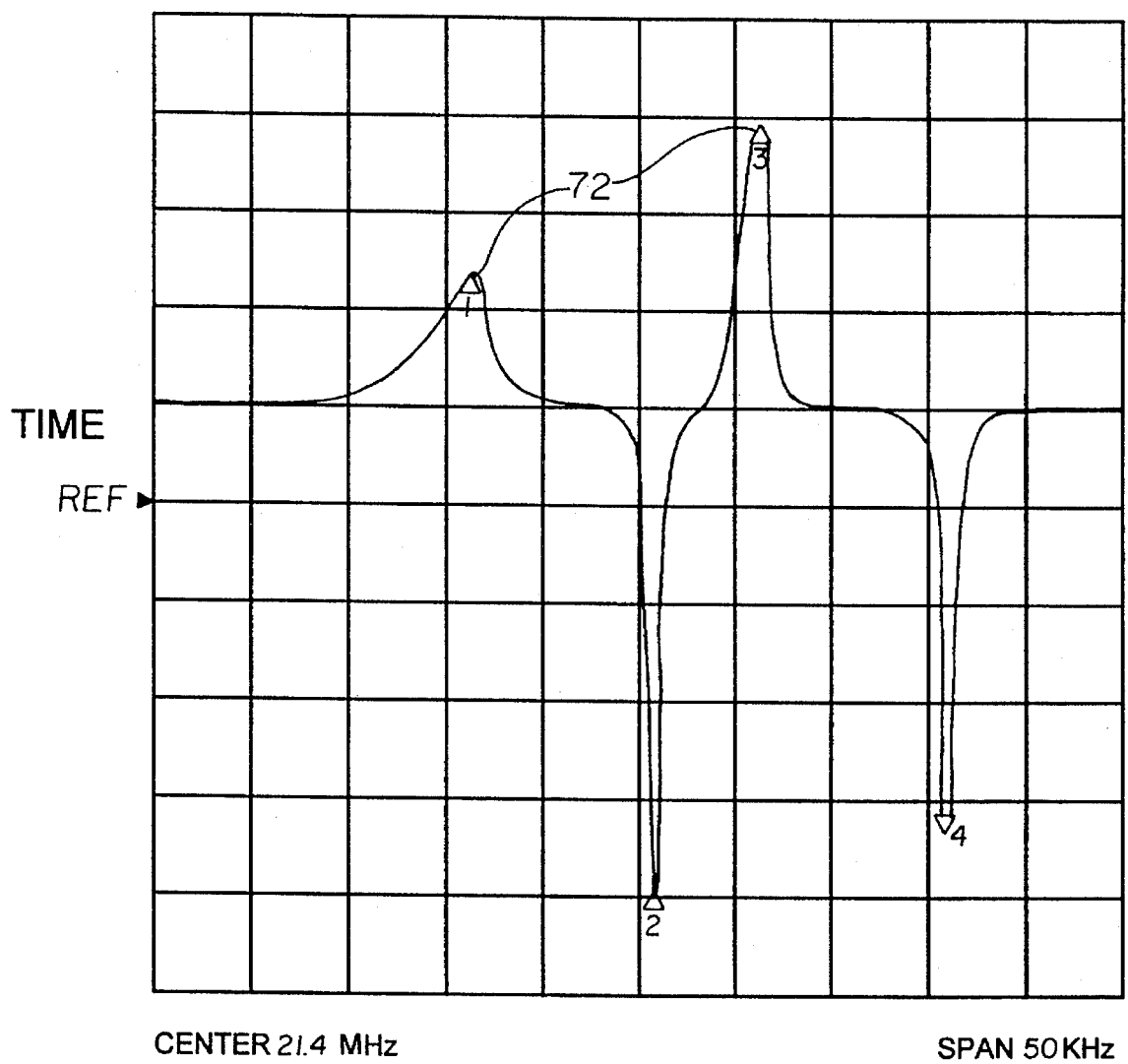
Figure 7I:
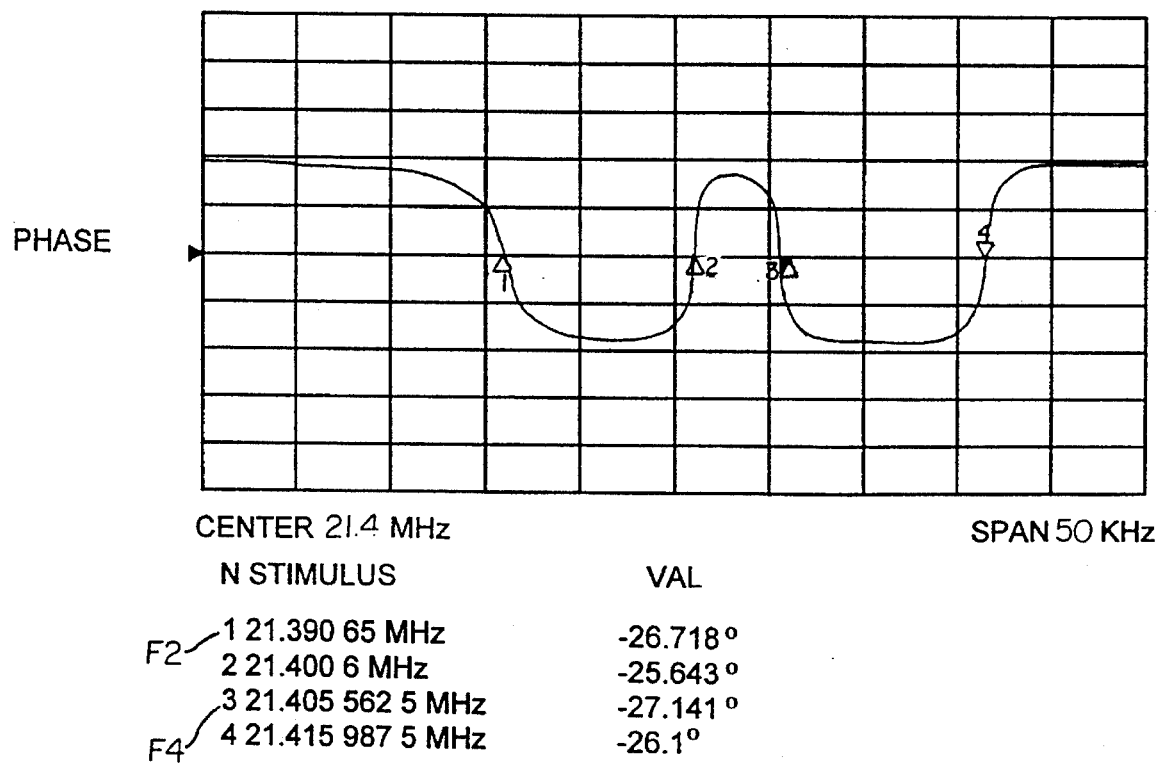
Figure 7J:
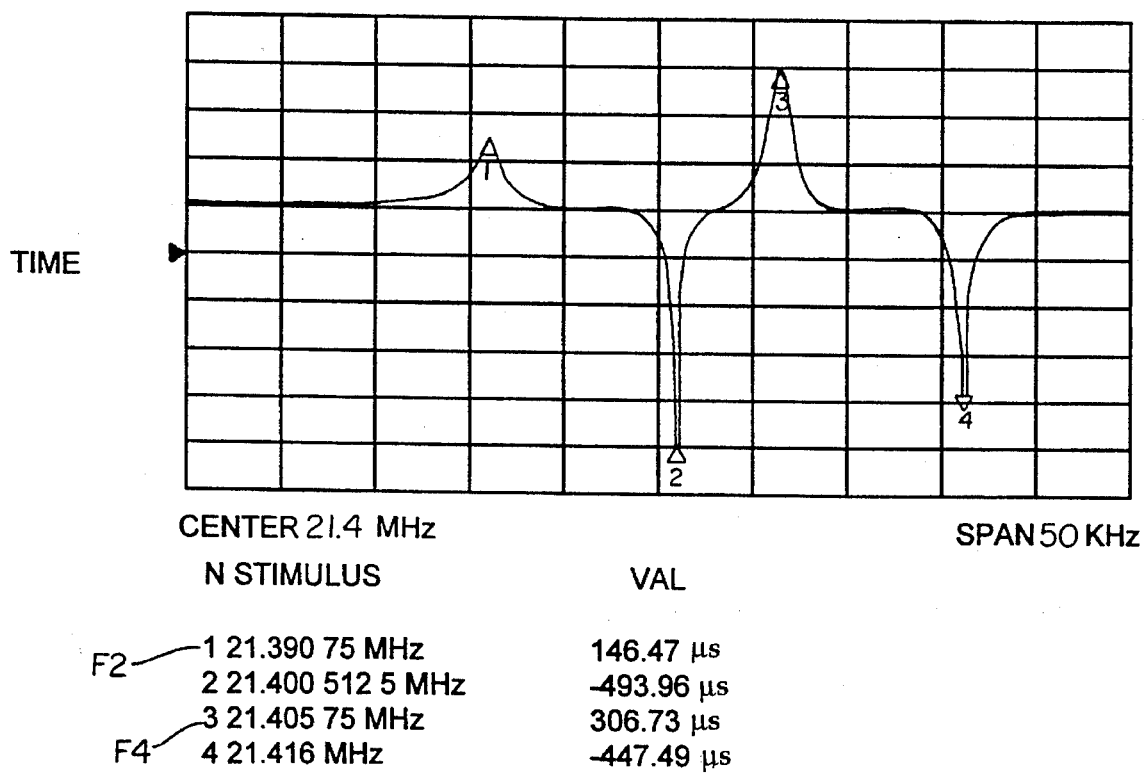

Similarly, for the case when resonator B is effectively open circuited with a 5 pf capacitance across it, FIGS. 7F through 7H show the amplitude response (FIG. 7F), the phase response (FIG. 7G) having several zero phase crossings 74, and a time delay response (FIG. 7H) having several maxima points 72. Referring to FIG. 7I, using the zero phase method, F2=21390650 Hz and F4=21405562 Hz. Referring to FIG. 7J, using the time delay maxima method, F2=21390750 Hz and F4=21405750 Hz.

Alternatively, it is noticed in FIG. 7E that F2 and F4 could also be determined by the time delay minima when resonator B is short circuited using case I.

Consequently, under the zero phase crossing method, FA=21394263 Hz, FB=21394688 Hz, SPSF=12792 Hz, and NCF=21,394,474 Hz. Whereas, under the time delay relative maxima method, FA=21394218 Hz, FB=21395033 Hz, SPSF=12648 Hz, and NCF=21394624 Hz. Therefore, even though the two sets of values for FA, FB, SPSF, and NCF are still very close to each other, the effects of the increases in effective resonator resistances are beginning to be measurable. Thus, even at 21.4 MHz, the improved accuracy of the time delay relative maxima method over the zero phase method for determining the four frequencies F1–F4 is detectable.

Figure 8A:
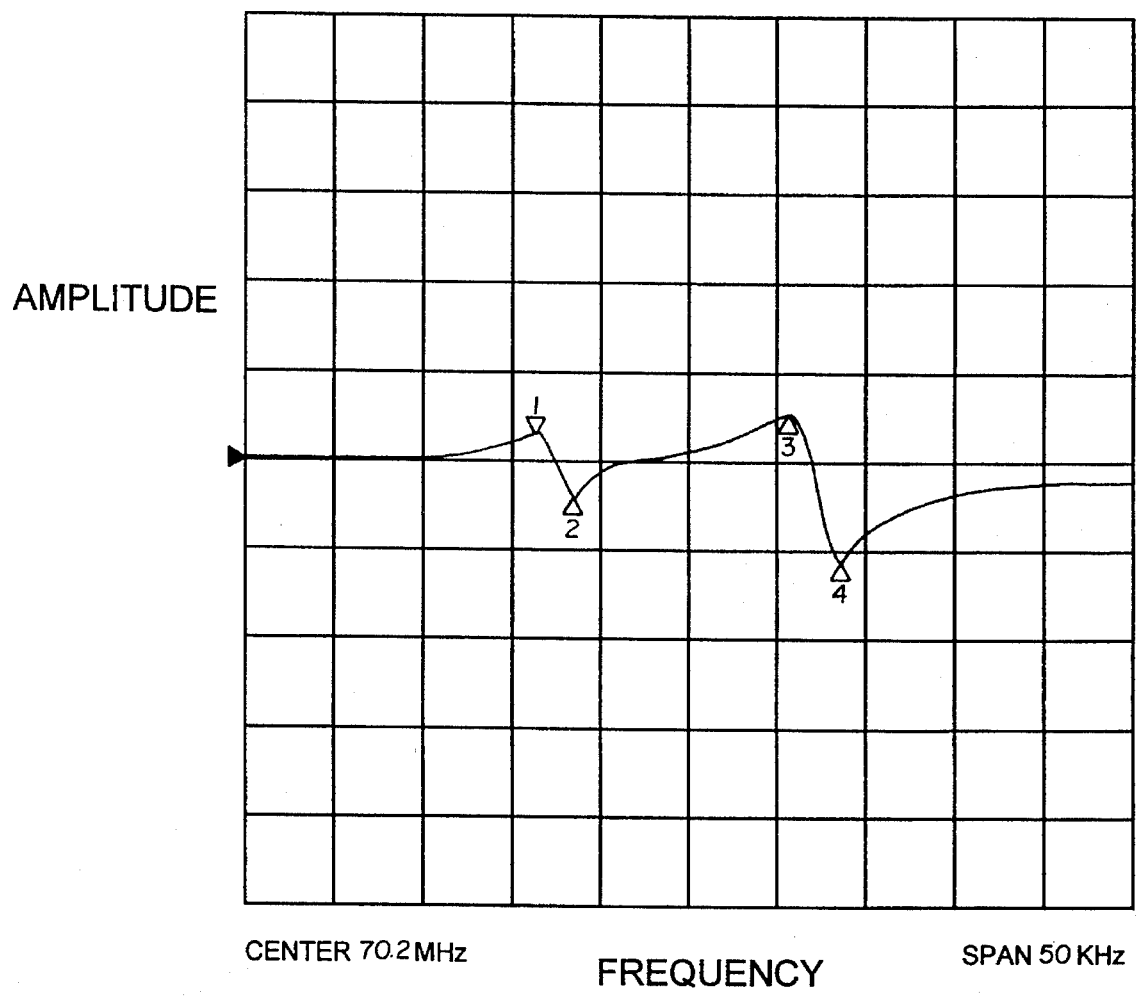
FIGS. 8A through 8J show voltage amplitude, phase, and time responses explaining the method of the present invention for a 70.2 MHz crystal.
Figure 8B:
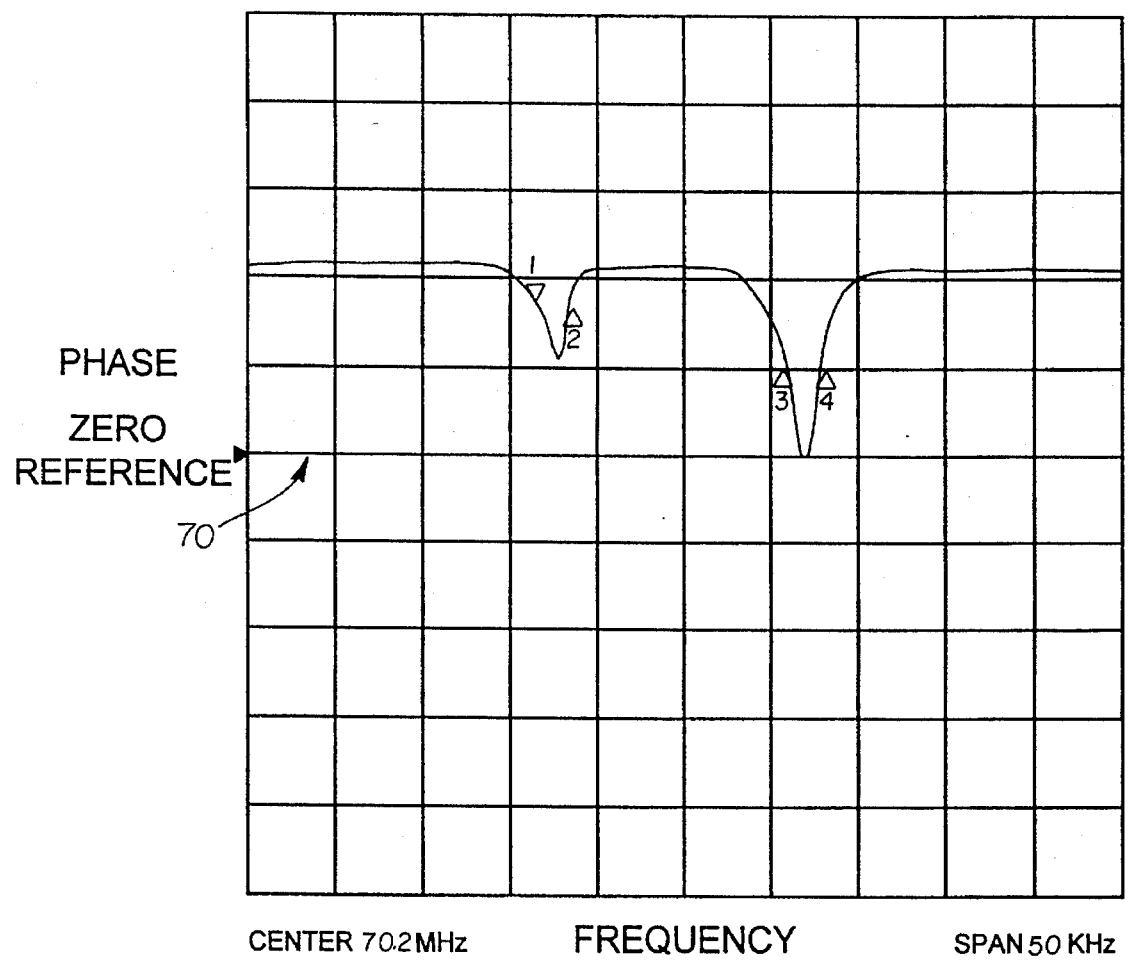
Figure 8C:
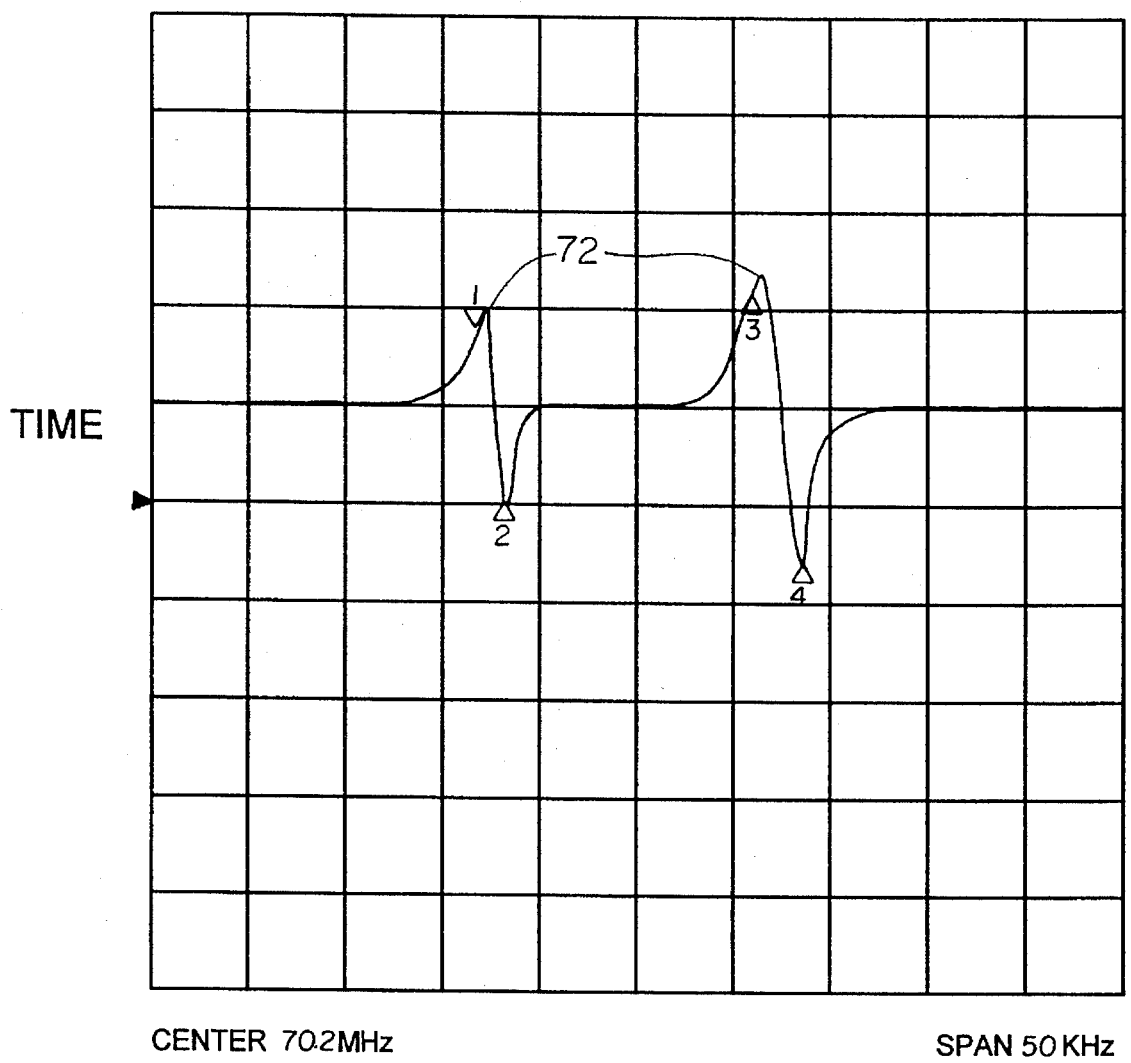

Next, with reference to FIGS. 8A through 8J, the process for obtaining the four frequencies F1–F4 for a coupled-dual resonator crystal in FIG. 4B operated at 70.2 MHz is described. When resonator B is short circuited, FIGS. 8A through 8C show the voltage amplitude response of the crystal (FIG. 8A), the phase response of the crystal (FIG. 8B), and the time delay response of the crystal (FIG. 8C) with the time delay relative maxima points 72. As shown in FIG. 8B, only one point of the phase response touches the zero phase line 70 in the neighborhood of the amplitude maxima.

It should be noted that the zero phase crossing method cannot be used to determine the four frequencies F1–F4 when the phase response does not cross the zero phase line without external compensation or using amplitude maxima whose frequencies are already known to be functions of the individual resonator resistances. However, the markers on FIGS. 8D and 8E show the frequency differences when resonator B is short circuited and FIGS. 8I and 8J show the differences in frequency when resonator B is effectively open circuited.

Figure 8D:
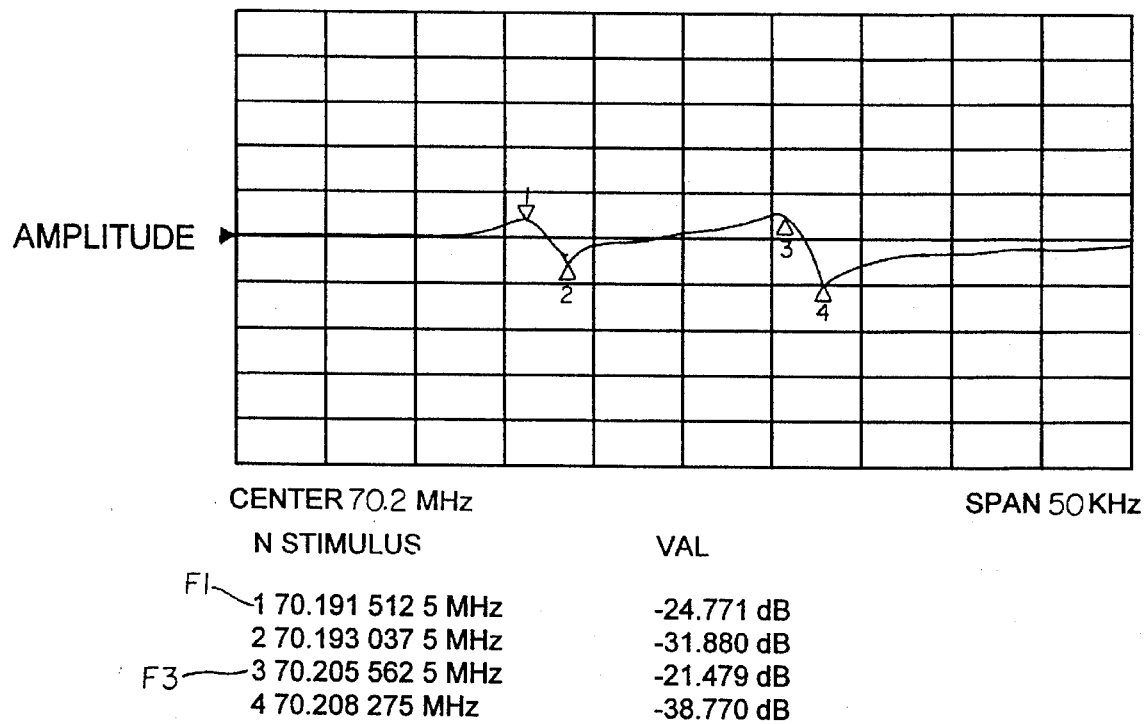
Figure 8E:
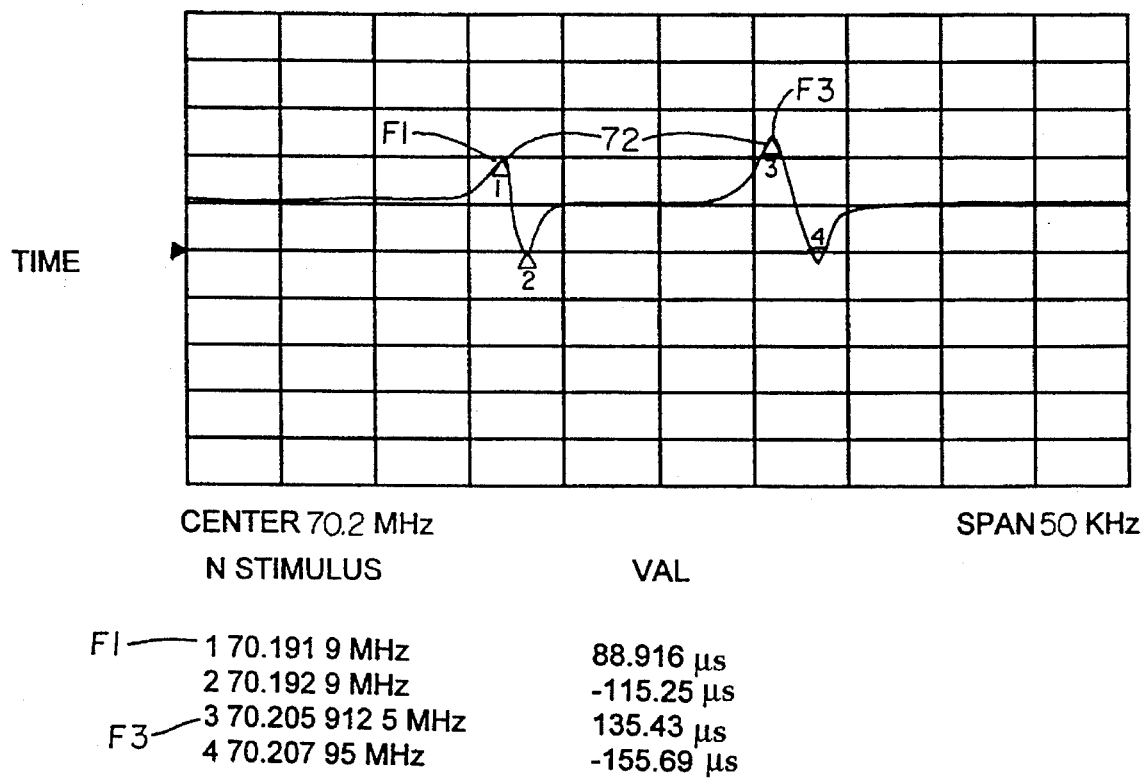

Consequently, referring to FIG. 8D, F1=70,191,512 Hz and F3=70,205,562 Hz. Referring to FIG. 8E, using the time delay relative maxima method, F1=70,191,900 Hz and F3=70,205,912 Hz.

Figure 8F:
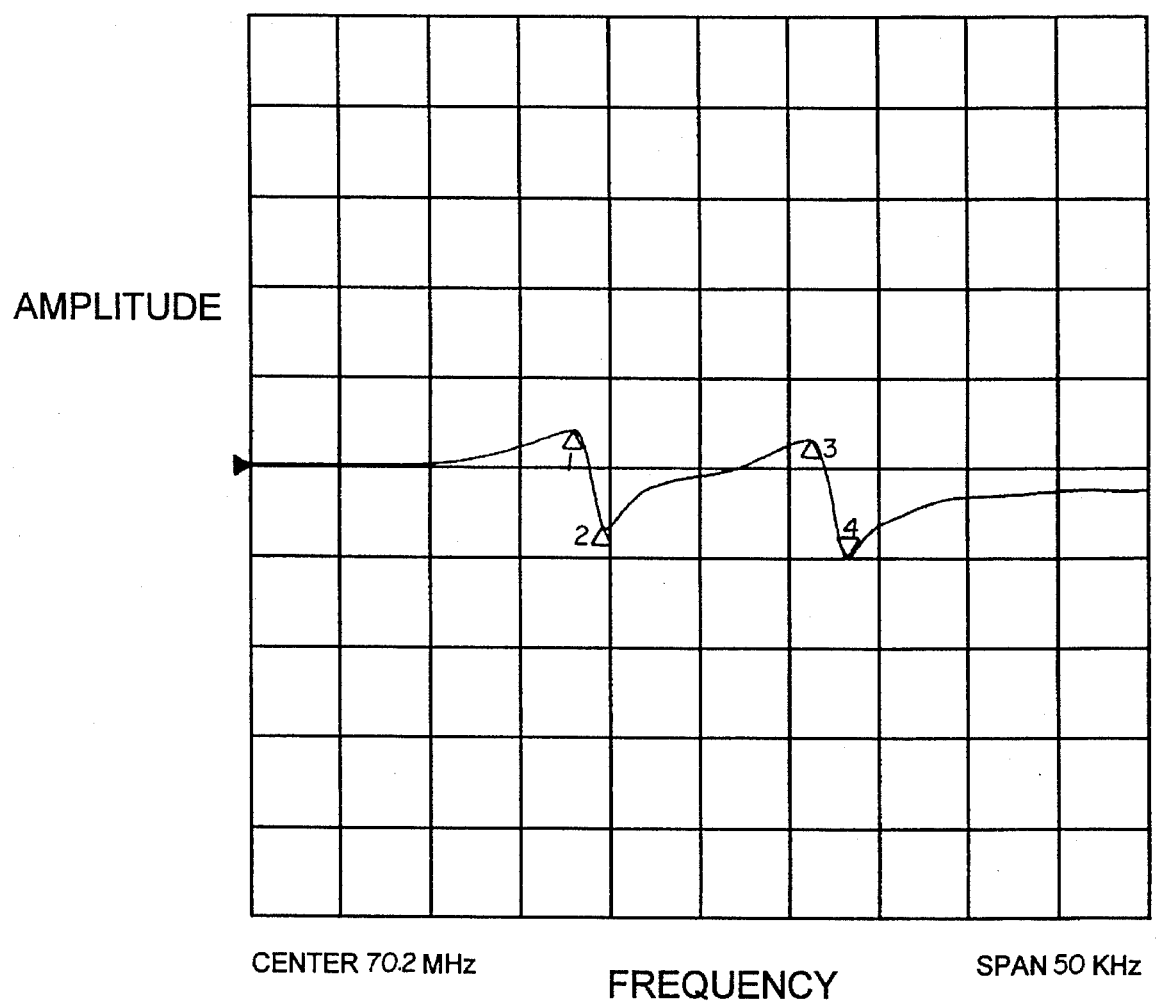
Figure 8G:
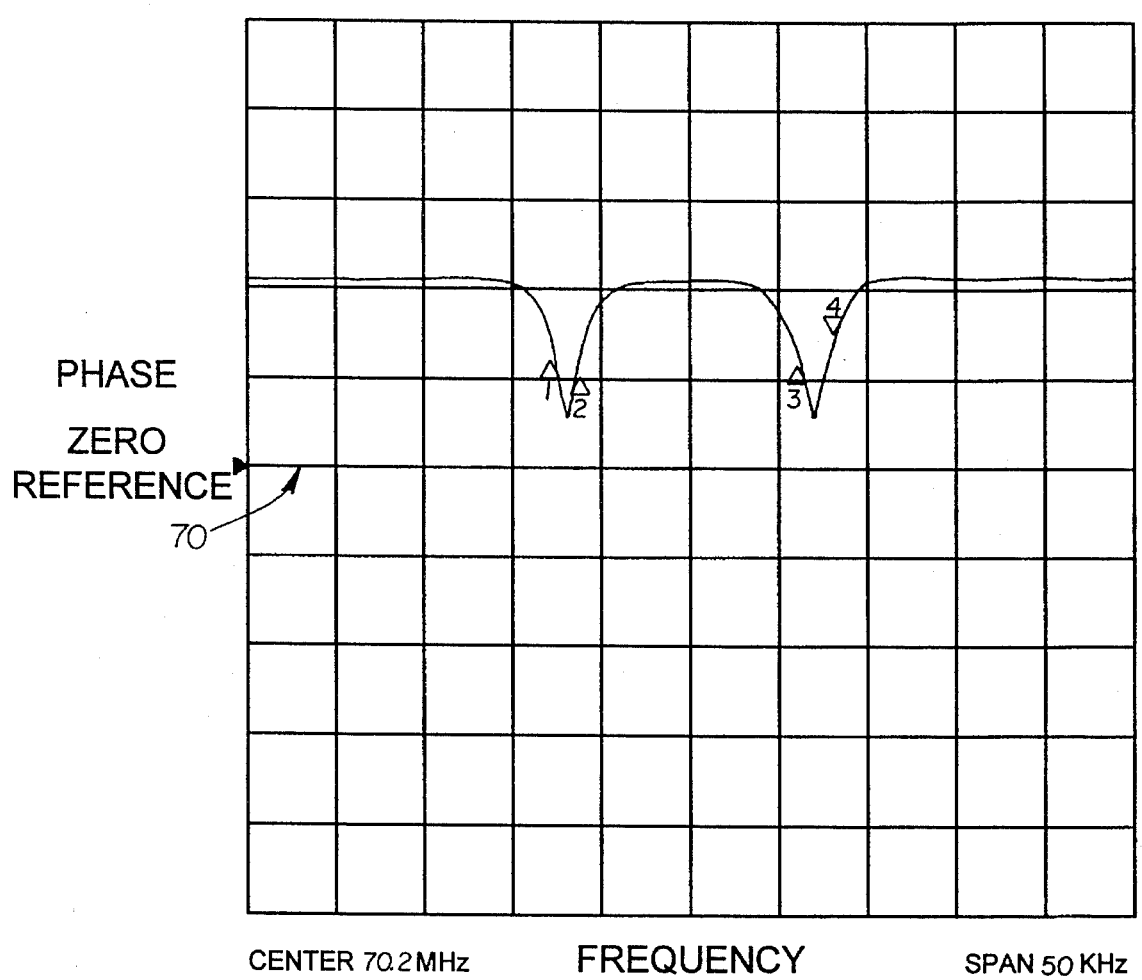
Figure 8H:
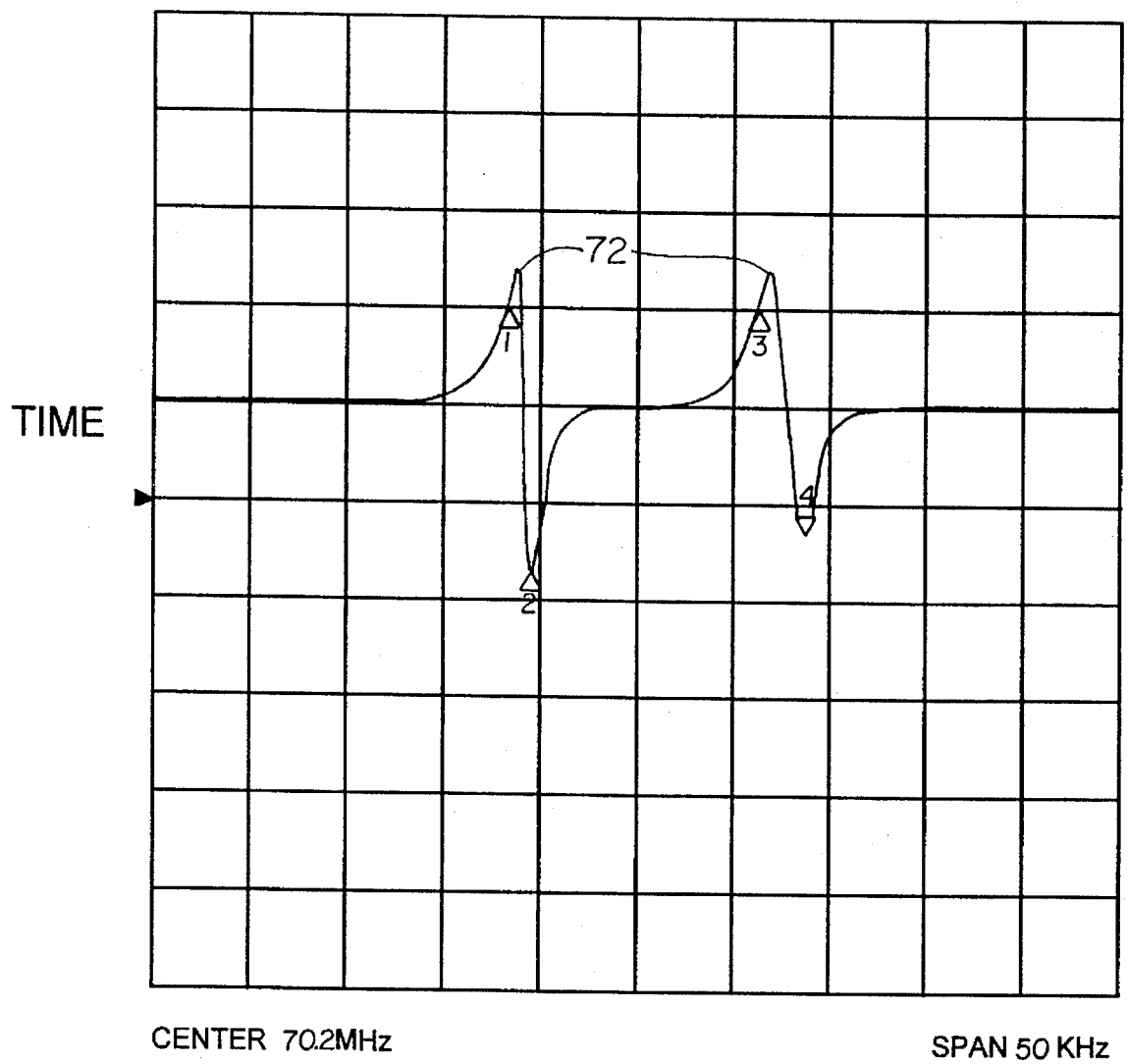

Similarly, when resonator B is effectively open circuited, FIGS. 8F through 8H show the amplitude response of the crystal (FIG. 8F), the phase response of the crystal (FIG. 8G), and the time delay response (FIG. 8H) of the crystal having several maxima points 72. As shown in FIG. 8G, the phase response does not cross the zero phase line 70. Referring to FIG. 8I, using frequency at the amplitude maxima, F2=70,192,662 Hz and F4=70,205,925 Hz. Referring to FIG. 8J, using the time delay relative maxima method, F2=70,192,975 Hz and F4=70,206,200 Hz.

Figure 8I:
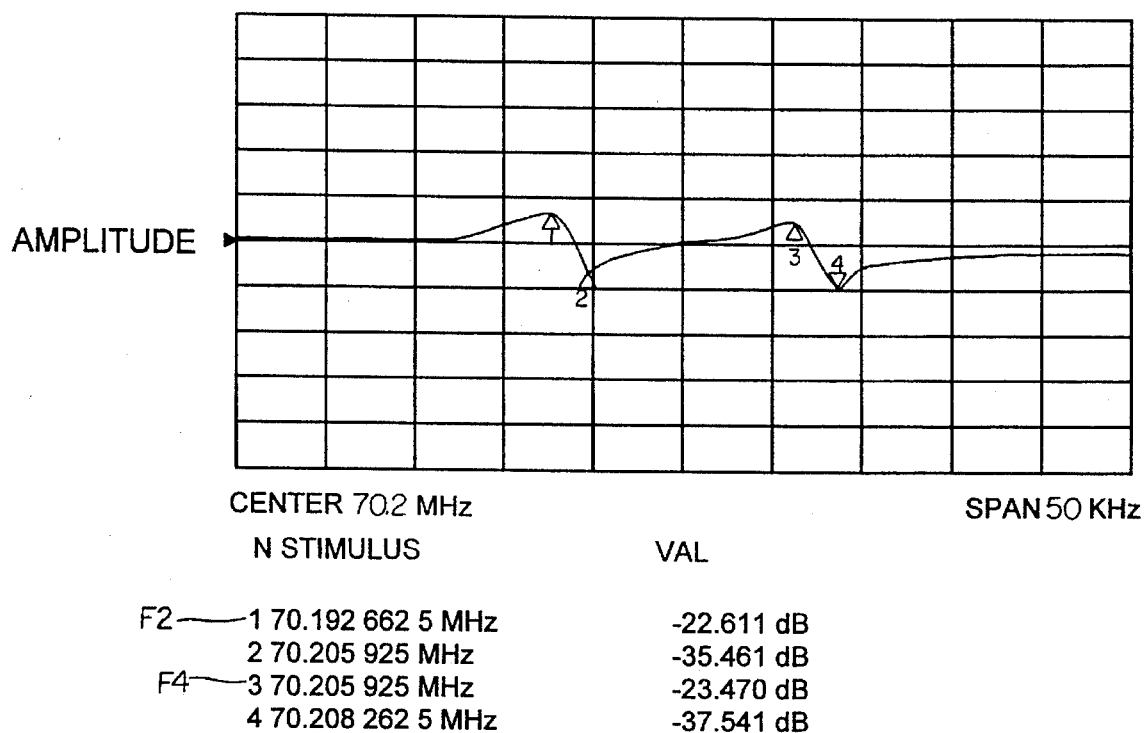
Figure 8J:
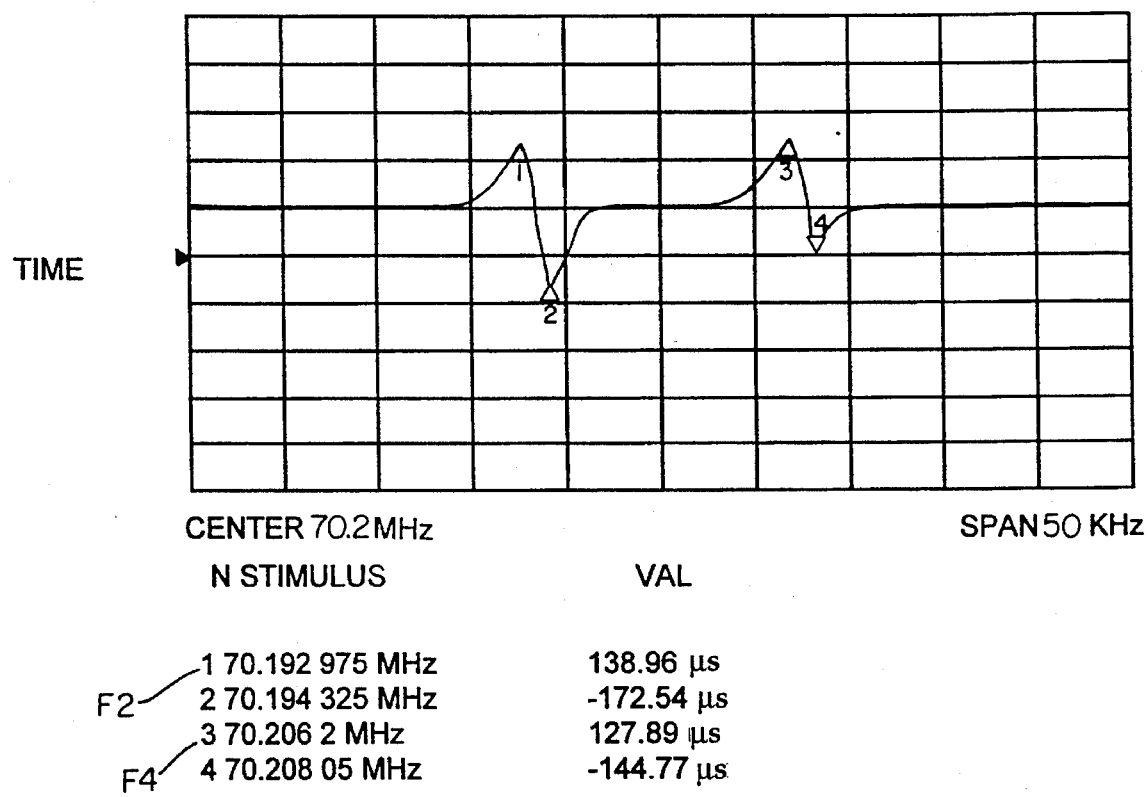

If we consider the frequency at which the amplitude maxima occur, F1=70191512 Hz and F3=70205562 (see FIG. 8D) and F2=70192662 Hz and F4=70205925 Hz (see FIG. 8I). These values, when used in equations (1)–(4), result in the following values for FA, FB, and SPSF: FA=70202467 Hz, FB=70194608 Hz, SPSF=11646 Hz and NCF=70198537 Hz. Using the time delay relative maxima process, F1=70191900 Hz and F3=70205912 Hz (see FIG. 8E) and F2=70192975 Hz and F4=70206200 Hz (FIG. 8J). Under the time delay relative maxima process, using equations (1)–(4), FA=70203178 Hz, FB=70194634 Hz, SPSF=11105 Hz and NCF=70198906 Hz.

Although the values for FB are close, the difference in values for FA and SPSF are too large to be acceptable. Because the frequencies of the time delay maxima tend to be independent of resistances of the resonators, the differences between values determined by processes other than the time delay relative maxima process will be greater in situations where the resistances are higher and vice versa. Therefore, a coupled-dual resonator crystal operated at 70.2 MHz cannot be measured using the a zero phase crossing method to determine the four frequencies without an external compensation network. If frequencies where the amplitude maxima occur are used, errors will be produced which are a function of the size of the effective resonator resistances and which vary from crystal to crystal. When the frequencies at which the time delay relative maxima occur are used, the errors are eliminated since these frequencies are independent of the effective resonator resistances.

As shown by the three examples of coupled-dual resonator crystals at 11.2 MHz, 21.4 MHz, and 70.2 MHz, the effects of resonator resistance becomes more pronounced as the frequency of operation of the particular coupled-dual resonator crystal goes up. The present invention allows measurement using the frequencies at the time delay relative maxima to detect the four frequencies for calculating FA, FB, and SPSF very accurately and repeatably because the frequencies of the time delay relative maxima tend to be independent of resonator resistances.

While the preferred embodiment of the present invention has been described, it should be appreciated that various modifications may be made by those skilled in the art without departing from the spirit and scope of the present invention. Accordingly, reference should be made to the claims to determine the scope of the present invention.

What is claimed is:

1. A method of accurately measuring frequencies of a coupled-dual resonator crystal having a piezoelectric plate, a first electrode on the plate, a common electrode on the plate, a second electrode on the plate, the method comprising the steps of:

connecting a frequency synthesizer to the first electrode and to a reference point;

applying a plurality of frequencies to the first electrode;

monitoring a phase response of the crystal with respect to frequency;

monitoring a time response of the crystal with respect to frequency;

determining time delay relative maxima from the time response; and determining critical frequencies corresponding to the time delay relative maxima, whereby the critical frequencies are used in the calculation of crystal frequency characteristic values, and all of the critical frequencies and the crystal frequency characteristic values can be determined and calculated, respectively, at any stage in a fabrication process without the necessity of re-tuning or re-calibration.

2. The method of claim 1 wherein the common electrode is connected to the second electrode by a switch, the switch being in a closed position and the method further comprising the steps of:

determining time delay relative minima of the time response; and wherein the critical frequencies correspond to the time delay relative maxima and the time delay relative minima.

3. The method of claim 1, wherein the second electrode is connected to the common electrode by a capacitor.

4. The method of claim 1, wherein the second electrode and common electrode are open circuited.

5. A method of accurately measuring frequencies of a coupled-dual resonator crystal having a piezoelectric plate, a first electrode on the plate, a common electrode on the plate, and a second electrode on the plate, wherein a connection of the first electrode and the common electrode forms a first resonator and a connection of the second electrode and the common electrode forms a second resonator, the method comprising the steps of:

connecting a frequency synthesizer to the first electrode, wherein an oscillator creates a plurality of frequencies;

connecting the second electrode and the common electrode so that the second resonator is short circuited;

applying a plurality of frequencies to the first electrode with the second resonator short circuited;

monitoring a phase response of the crystal with respect to frequency with the second resonator short circuited;

monitoring a time response of the crystal with respect to frequency with the second resonator short circuited;

determining time delay relative maxima for the time response with the second resonator short circuited;

determining the first set of critical frequencies corresponding to the time delay relative maxima;

connecting the second electrode and the common electrode so that the second resonator is open circuited;

applying a plurality of frequencies to the first electrode with the second resonator open circuited;

monitoring a phase response of the crystal with respect to frequency with the second resonator open circuited;

monitoring a time response of the crystal with the second resonator open circuited;

determining time delay relative maxima for the time response with the second resonator open circuited;

determining a second set of critical frequencies corresponding to the time delay relative maxima; and whereby the critical frequencies are used in the calculation of crystal frequency characteristic values, and all of the critical frequencies and the crystal frequency characteristic values can be determined and calculated, respectively, at any stage in a fabrication process without the necessity of re-tuning or re-calibration.

6. A method of accurately measuring frequencies of a coupled-dual resonator crystal having a piezoelectric plate, a first electrode on the plate, a common electrode on the plate, and a second electrode on the plate, the method comprising the steps of:

connecting a frequency synthesizer to the first electrode, wherein an oscillator creates a plurality of frequencies;

connecting the second electrode and the common electrode so that the connection is a short circuit;

applying a plurality of frequencies to the first electrode;

monitoring a phase response of the crystal with respect to frequency;

monitoring a time response of the crystal with respect to frequency;

determining time delay relative maxima and minima for the time response; and determining critical frequencies corresponding to the time delay relative maxima and minima, whereby the critical frequencies can be used in the calculation of crystal frequency characteristic values, and the critical frequencies are determined and the crystal frequency characteristic values calculated at any stage in a fabrication process without the necessity of re-tuning or re-calibration.

7. A method of accurately measuring frequencies of a coupled-dual resonator crystal having a piezoelectric plate, a first electrode on the plate, a common electrode on the plate, and a second electrode on the plate, the method comprising the steps of:

connecting a frequency synthesizer to the first electrode and to a reference point;

applying a plurality of frequencies to the first electrode;

monitoring a phase response of the crystal with respect to frequency;

determining inflection points where the change in phase goes from monotonically decreasing to monotonically increasing; and determining critical frequencies corresponding to the inflection points, whereby the critical frequencies are used in the calculation of crystal frequency characteristic values and all of the critical frequencies and the crystal frequency characteristic values can be determined and calculated, respectively, at any stage in a fabrication process without the necessity of re-tuning or re-calibration.

8. The method of claim 7 wherein the common electrode is connected to the second electrode by a switch, the switch being in a closed position and the method further comprising the steps of:

determining the inflection points where the change in phase goes from monotonically decreasing to monotonically increasing and also where the change in phase goes from monotonically increasing to monotonically decreasing, wherein the critical frequencies correspond to the inflection points.

9. The method of claim 7, wherein the second electrode is connected to the common electrode by a capacitor.

10. The method of claim 7, wherein the second electrode and common electrode are open circuited.

11. A method of accurately measuring frequencies of a coupled-dual resonator crystal having a piezoelectric plate, a first electrode on the plate, a common electrode on the plate, and a second electrode on the plate, the method comprising the steps of:

connecting a frequency synthesizer to the first electrode, wherein an oscillator creates a plurality of frequencies;

connecting the second electrode and the common electrode so that the connection is a short circuit;

applying a plurality of frequencies to the first electrode;

monitoring a phase response of the crystal with respect to frequency;

determining inflection points where the change in phase goes from monotonically decreasing to monotonically increasing and also where the change in phase goes from monotonically increasing to monotonically decreasing; and determining critical frequencies corresponding to the inflection points, whereby the critical frequencies are used in the calculation of crystal frequency characteristic values and all of the critical frequencies and the crystal frequency characteristic values can be determined and calculated, respectively, at any stage in a fabrication process without the necessity of re-tuning or re-calibration.

* * * * *